(12) United States Patent
Suzuki

(10) Patent No.: US 11,537,537 B2
(45) Date of Patent: Dec. 27, 2022

(54) SEMICONDUCTOR DEVICE AND METHOD

(71) Applicant: Kioxia Corporation, Tokyo (JP)

(72) Inventor: Tomoaki Suzuki, Chigasaki (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/200,427

(22) Filed: Mar. 12, 2021

(65) Prior Publication Data

US 2022/0083479 A1 Mar. 17, 2022

(30) Foreign Application Priority Data

Sep. 16, 2020 (JP) .............................. JP2020-155799

(51) Int. Cl.
*G06F 13/16* (2006.01)
*G06F 13/28* (2006.01)

(52) U.S. Cl.
CPC .......... *G06F 13/1668* (2013.01); *G06F 13/28* (2013.01)

(58) Field of Classification Search
None
See application file for complete search history.

(56) References Cited

U.S. PATENT DOCUMENTS

| | | | |
|---|---|---|---|
| 6,751,698 B1* | 6/2004 | Deneroff | G06F 15/17343 710/317 |
| 7,016,994 B2* | 3/2006 | Winkler | G06F 13/36 710/305 |
| 7,702,839 B2 | 4/2010 | Klint et al. | |
| 7,957,173 B2 | 6/2011 | Kim | |
| 8,635,394 B2 | 1/2014 | Klint et al. | |
| 10,509,595 B2 | 12/2019 | Tanaka et al. | |
| 10,615,829 B1* | 4/2020 | Kondareddy | H04B 15/04 |
| 10,776,527 B2* | 9/2020 | Hershman | G06F 13/4282 |
| 2010/0091538 A1* | 4/2010 | Kim | G11C 7/1003 365/191 |
| 2010/0115172 A1 | 5/2010 | Gillingham et al. | |
| 2010/0115214 A1 | 5/2010 | Pyeon | |
| 2011/0194365 A1 | 8/2011 | Kim et al. | |
| 2012/0134194 A1 | 5/2012 | Kim et al. | |
| 2014/0019705 A1 | 1/2014 | Pyeon et al. | |
| 2014/0201423 A1 | 7/2014 | Jean et al. | |
| 2014/0241080 A1 | 8/2014 | Kim | |
| 2015/0325288 A1 | 11/2015 | Balluchi et al. | |
| 2016/0351263 A1 | 12/2016 | Balluchi et al. | |
| 2017/0256319 A1 | 9/2017 | Balluchi et al. | |

(Continued)

FOREIGN PATENT DOCUMENTS

| | | |
|---|---|---|
| JP | 2008-536230 A | 9/2008 |
| JP | 2012-43024 A | 3/2012 |

(Continued)

*Primary Examiner* — Michael Sun
(74) *Attorney, Agent, or Firm* — Oblon, McClelland, Maier & Neustadt, L.L.P.

(57) ABSTRACT

A semiconductor device includes a terminal group configured to receive a first signal and a second signal from a host, a first chip electrically connected to the terminal group, and a second chip electrically connected to the terminal group. The first chip is configured to, in response to reception of the first signal, transmit a third signal corresponding to the first signal to the second chip. The first chip is configured to, when the first chip has received the second signal before the first signal, refrain from transmitting the third signal to the second chip.

9 Claims, 23 Drawing Sheets

(56) References Cited

U.S. PATENT DOCUMENTS

| | | |
|---|---|---|
| 2019/0035470 A1 | 1/2019 | Balluchi et al. |
| 2019/0146715 A1 | 5/2019 | Sugahara et al. |
| 2019/0244667 A1 | 8/2019 | Balluchi et al. |

FOREIGN PATENT DOCUMENTS

| | | |
|---|---|---|
| JP | 2012-505448 A | 3/2012 |
| JP | 2012-507763 A | 3/2012 |
| JP | 2015-111458 A | 6/2015 |
| JP | 2015-144006 A | 8/2015 |
| JP | 2017-524997 A | 8/2017 |
| JP | 6321682 B2 | 5/2018 |
| JP | 2018-101185 A | 6/2018 |
| JP | 2019-49976 A | 3/2019 |
| TW | 201506952 A | 2/2015 |
| WO | WO 2018/011926 A1 | 1/2018 |

\* cited by examiner

FIG.17

MULTI-READ COMMAND

- COMMAND VALUE REPRESENTING MULTI-READ COMMAND
- ADDRESS VALUE REPRESENTING INITIAL READ LOCATION
- INTERVAL SET VALUE
- READ COUNT SET VALUE

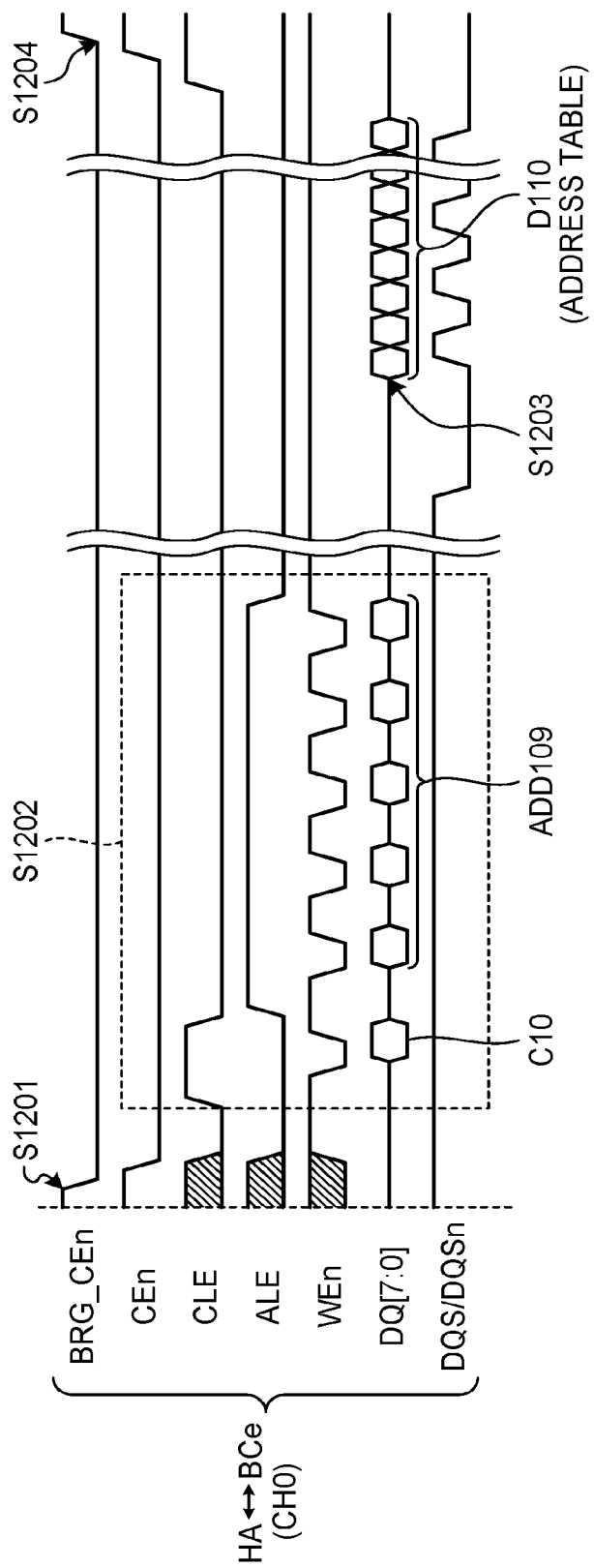

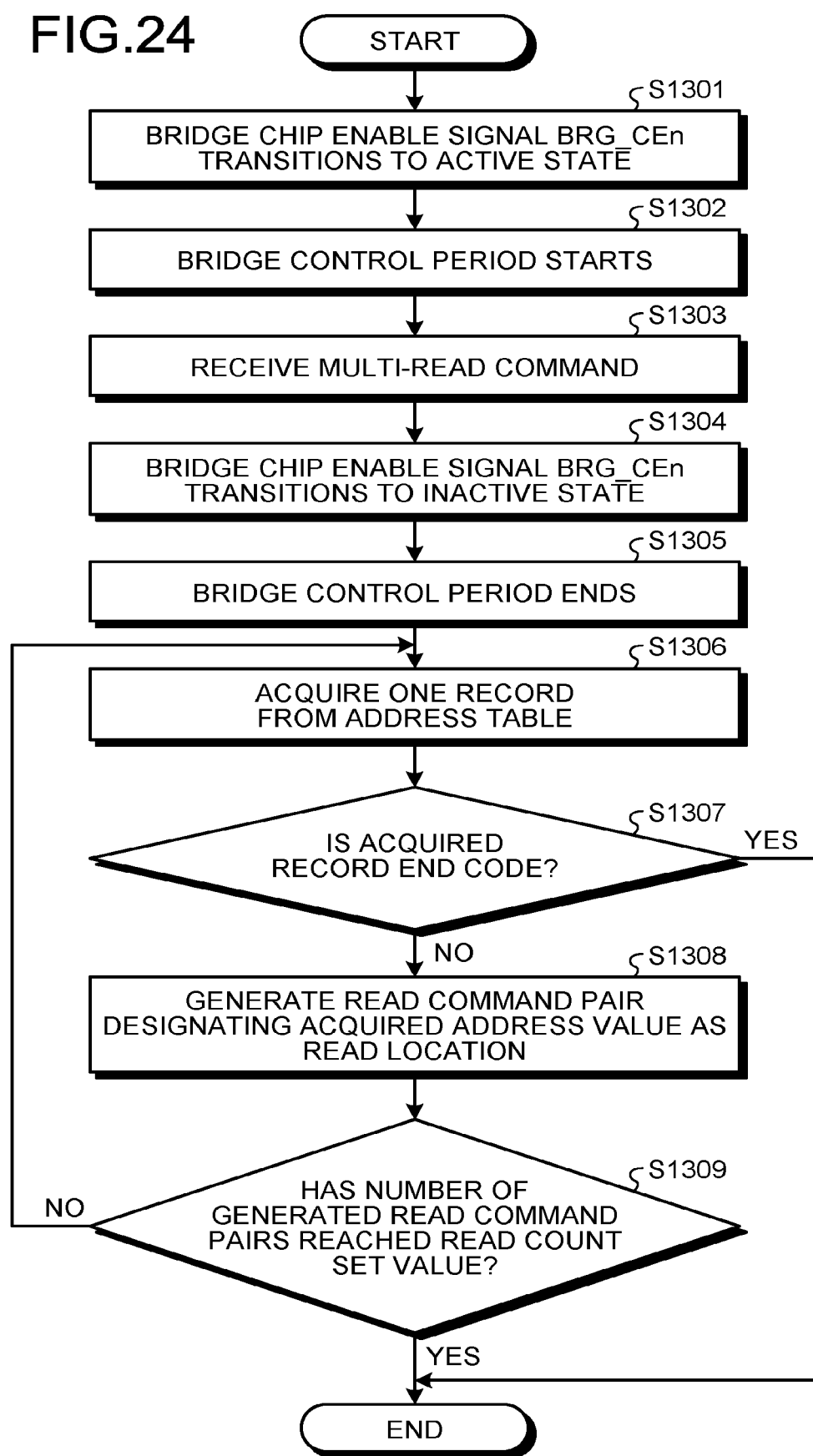

SEMICONDUCTOR DEVICE AND METHOD

CROSS-REFERENCE TO RELATED APPLICATIONS

This application is based upon and claims the benefit of priority from Japanese Patent Application No. 2020-155799, filed on Sep. 16, 2020; the entire contents of which are incorporated herein by reference.

FIELD

Embodiments described herein relate generally to a semiconductor device and method.

BACKGROUND

There are semiconductor devices incorporating an external terminal connected to a host, a plurality of memory chips, and a bridge chip located between the external terminal and the memory chips. In such a semiconductor device, the host accesses the memory chips via the bridge chip. It is desirable to improve the data transfer rate between the host and the memory chips.

BRIEF DESCRIPTION OF THE DRAWINGS

FIG. 17 is a schematic diagram illustrating an exemplary configuration of a multi-read command according to the fifth embodiment;

FIG. 23 is a timing chart illustrating a writing method of the address table according to the sixth embodiment; and FIG. 24 is a flowchart illustrating an operation of generating a plurality of read command pairs according to the sixth embodiment.

DETAILED DESCRIPTION

Figure 1:
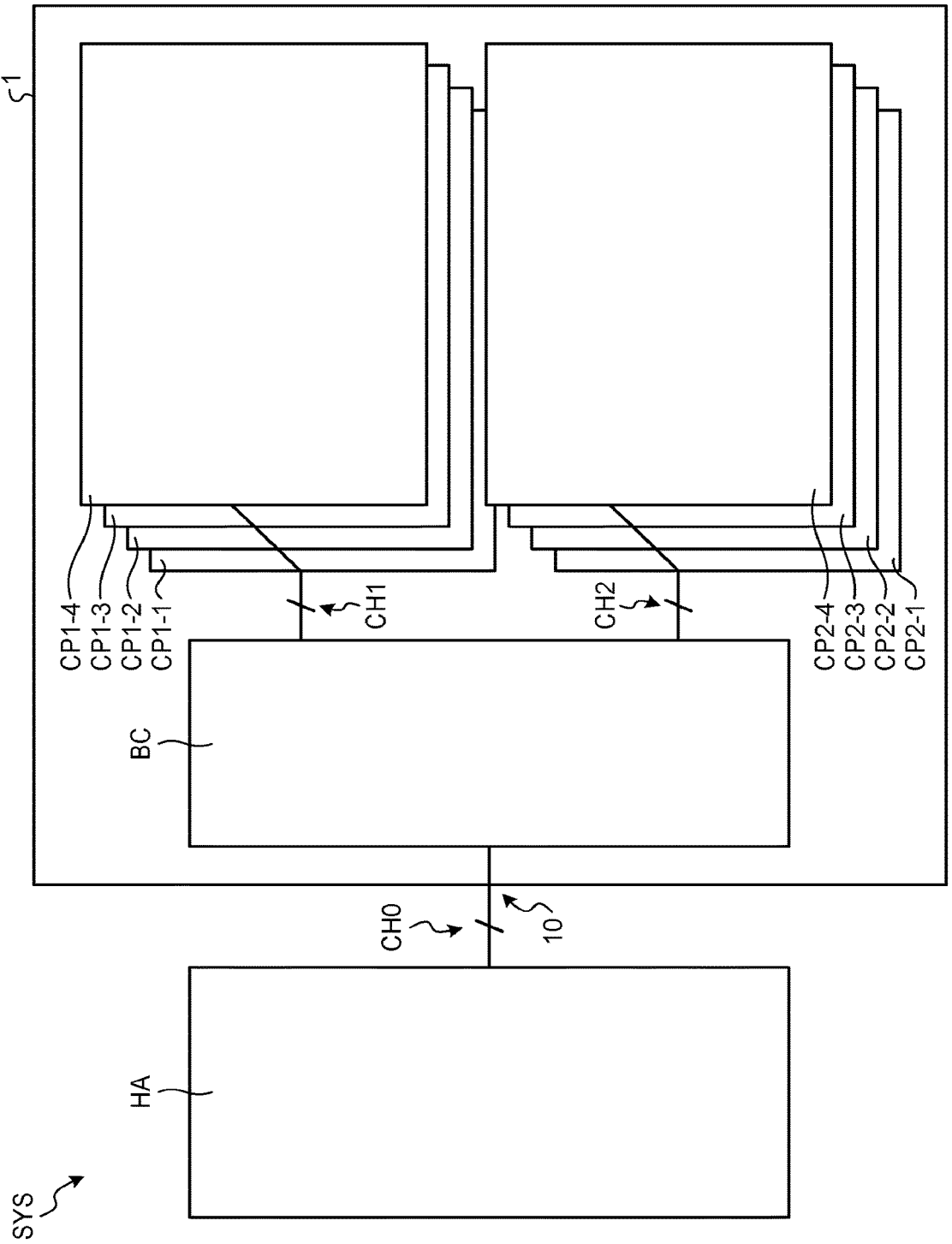
FIG. 1 is a schematic diagram illustrating an exemplary configuration of a storage system incorporating a semiconductor device according to a first embodiment.

According to one embodiment, in general, a semiconductor device includes a terminal group configured to receive a first signal and a second signal from a host, a first chip electrically connected to the terminal group, and a second chip electrically connected to the terminal group. The first chip is configured to, in response to reception of the first signal, transmit a third signal corresponding to the first signal to the second chip. The first chip is configured to, when the first chip has received the second signal before the first signal, refrain from transmitting the third signal to the second chip.

Hereinafter, embodiments of a semiconductor device and method will be described in detail with reference to the accompanying drawings. The following embodiments are presented for illustrative purpose only, and not intended to limit the scope of the present invention.

First Embodiment

A semiconductor device according to an embodiment includes an external terminal connectable to a host, a bridge chip being a first chip, and a memory chip being a second chip. The memory chip is connected to the external terminal via the bridge chip. The host is connected to the external terminal of the semiconductor device via a wired communication path. The host accesses a plurality of memory chips in this semiconductor device via the wired communication path through the bridge chip. Each of the memory chips is, for example, a non-volatile memory such as a NAND flash memory.

In order to expand the memory capacity of a memory system, semiconductor devices have been increasing in terms of the number of memory chips to incorporate. For example, the mounting density can be improved by stacking the memory chips on the top of each other. In such a case, for the purpose of reducing an electrical load on the connection to each memory chip and achieving a higher speed, memory vendors may place the bridge chip between the host and the memory chips to reduce a load per channel and improve the signal quality. Multiple memory chips are connectable to each channel.

There are demands for improved transfer performance in accessing the memory chips from the host via the bridge chip, as compared with via no bridge. However, a latency occurs at the time of a signal passing through the bridge chip, which lowers bus usage efficiency and deteriorates the transfer performance under a standard protocol. A conceivable solution to such a demand may be to prepare a particular command for controlling the operation of the bridge chip.

The data communication standard between the host and the semiconductor device does not define actual operations for all command values. Memory vendors often assign an optional control to an undefined command value. Such a vendor's unique command is referred to as vendor specific command. Such a command value can be assigned to a control command for the operation of the bridge chip.

The vendor specific command is, however, usable for various applications, so that few command values remain to be assignable to the control of the bridge chip.

In the case of using no vendor specific command, it is conceivable to write information to an operation control register of the bridge chip or to refer to information in the register, using an existing register access command prepared by the standard, such as a Read Status command or a Set/Get Feature command.

However, such an existing command can be not only received by the bridge chip but also transmitted to the memory chip through the bridge chip. In response to receiving a register access command irrespective of the address of the command, the memory chip may execute certain operation as defined by the standard, and the bridge chip may complete an operation according to the register access command. Even in such a case the memory chip may take a longer time to execute the standard-defined operation than the bridge chip's operation. In this case, the host is forced to wait for transmission of a next command until completion of the operation by the memory chip. This will generate unnecessary waiting time, resulting in degrading the data transfer rate between the host and the memory chips.

In a first embodiment, the bridge chip is configured to be able to receive a specific signal from the host. In response to receiving the specific signal, the bridge chip interprets a succeeding signal (including a command) as a signal addressed to itself. In addition, the bridge chip refrains from transferring the signal subsequent to the specific signal to any of the memory chips. Thus, the memory chip starts no operation ascribable to the signal addressed to the bridge chip. This can prevent the memory chip from executing an unintended operation in response to the signal addressed to the bridge chip.

Next, a semiconductor device according to the first embodiment will be described. The first embodiment is applicable in combination with any of second to sixth embodiments and modifications thereof, which will be described later.

FIG. 1 is a schematic diagram illustrating an exemplary configuration of a storage system SYS to which a semiconductor device 1 according to the first embodiment is applied.

The storage system SYS includes a host HA and the semiconductor device 1. The semiconductor device 1 includes a bridge chip BC and a plurality of memory chips CP1-1 to CP1-4 and CP2-1 to CP2-4. The semiconductor device 1 can be mounted as a multi-chip package (MCP) incorporating the memory chips CP1-1 to CP1-4 and the memory chips CP2-1 to CP2-4 placed on the top of each other. In the semiconductor device 1 being the MCP, the periphery around the bridge chip BC and the memory chips CP1-1 to CP1-4 and CP2-1 to CP2-4 may be sealed with a mold resin. In FIG. 1, the four memory chips CP1-1 to CP1-4 are connected to the bridge chip BC via a channel CH1 and the four memory chips CP2-1 to CP2-4 are connected to the bridge chip BC via a channel CH2 by way of example. That is, the semiconductor device 1 can be configured as a multi-memory chip module including the plurality of (herein, eight) memory chips CP1-1 to CP1-4 and CP2-1 to CP2-4. Each of the memory chips CP1-1 to CP1-4 and CP2-1 to CP2-4 is, for example, a non-volatile memory such as a NAND flash memory.

The host HA may be a device to control the semiconductor device 1, such as a controller, or a processor included in an electronic device, such as a computer or a mobile terminal. The semiconductor device 1 can be connected to the host HA via a wired communication path (for example, a serial bus) CH0. The semiconductor device 1 and the host HA are connected via the wired communication path CH0 configured by a given standard. In the case of the memory chips CP1-1 to CP1-4 and CP2-1 to CP2-4 being NAND flash memories, the given standard may be, for example, a toggle DDR standard. The wired communication path CH0 functions as a toggle DDR interface, for example.

The bridge chip BC is electrically connected between an external terminal group 10 and the plurality of (herein, two) channels CH1 and CH2. The external terminal group 10 can be electrically connected to the host HA via the wired communication path CH0. The memory chips CP1-1 to CP1-4 and CP2-1 to CP2-4 are connected to the bridge chip BC via the channels CH1 and CH2. The memory chips CP1-1 to CP1-4 are connected to the channel CH1 configured by a given standard. The memory chips CP2-1 to CP2-4 are connected to the channel CH2 configured by a given standard. In the case of the memory chips CP1-1 to CP1-4 and CP2-1 to CP2-4 being NAND flash memories, the given standard may be, for example, a toggle DDR standard.

Figure 2:
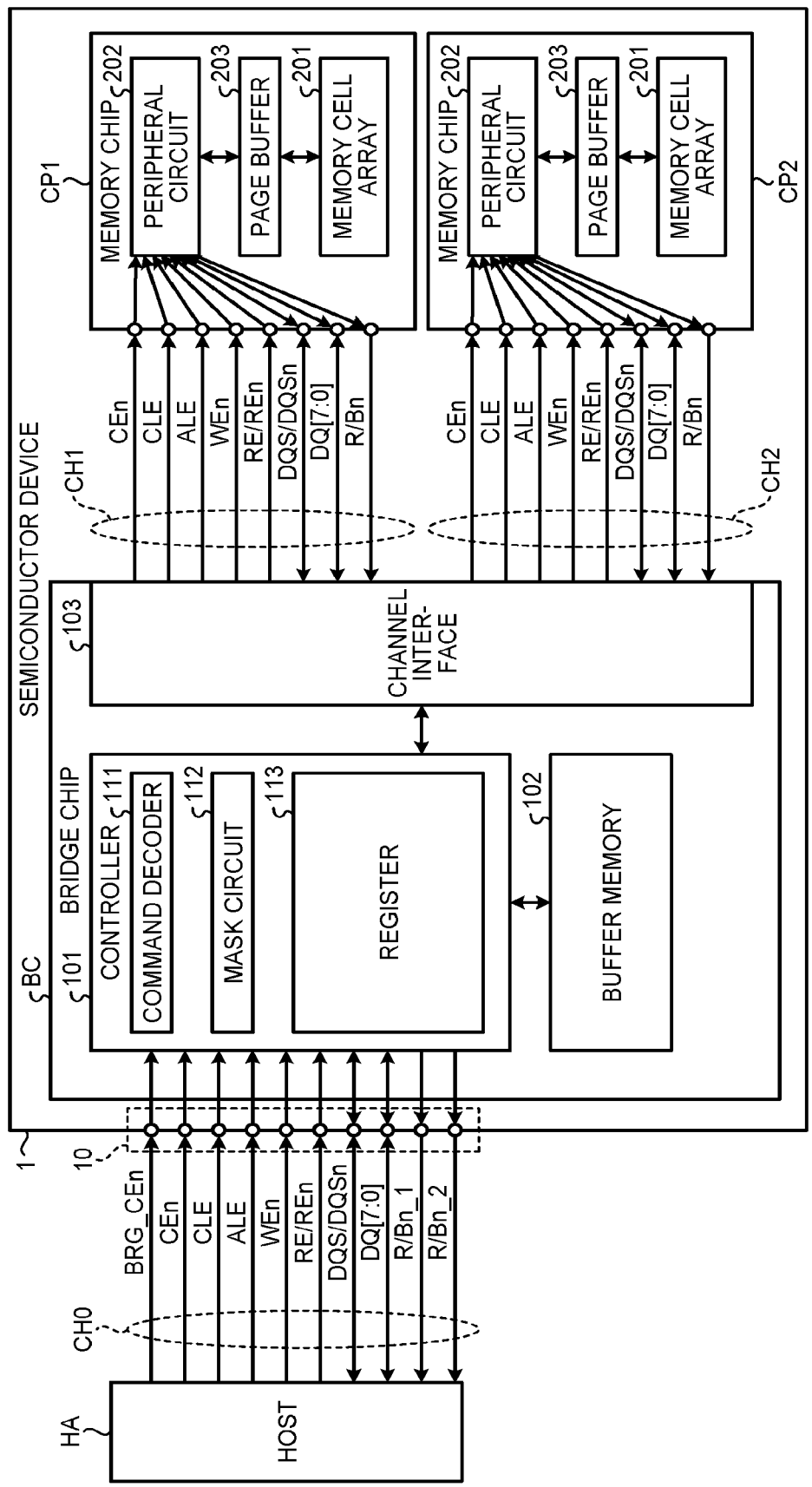
FIG. 2 is a schematic diagram illustrating an exemplary configuration of the semiconductor device according to the first embodiment.

FIG. 2 is a schematic diagram illustrating an exemplary configuration of the semiconductor device 1 of the first embodiment. FIG. 2 illustrates one memory chip CP1 representing the memory chips CP1-1 to CP1-4 and one memory chip CP2 representing the memory chips CP2-1 to CP2-4 for the sake of simplification. Hereinafter, the memory chips CP1-1 to CP1-4 and CP2-1 to CP2-4 may be collectively referred to as a memory chip CP.

The channel CH0 includes a signal line for transferring a bridge chip enable signal BRG_CEn serving as a specific signal, a signal line for transferring a chip enable signal CEn, a signal line for transferring a command latch enable signal CLE, a signal line for transferring an address latch enable signal ALE, a signal line for transferring a write enable signal WEn, a signal line for transferring a read enable signal RE/REn, a signal line for transferring a data strobe signal DQS/DQSn, a signal line for transferring a data signal DQ[7:0], and a signal line for transferring a ready/busy signal R/Bn. Among the signal lines constituting the channel CH0, the signal line for transferring the bridge chip enable signal BRG_CEn corresponds to a non-standard, specific signal line. The external terminal group 10 is provided with terminals corresponding to the signal lines constituting the channel CH0, and receives the signal lines through the terminals. The letter "n" at the end of reference signs represents that the signals operate with negative logic. Whether each signal operates with negative logic or positive logic can be freely designed. Regarding the ready/busy signal R/Bn, an H level indicates a ready state and an L level indicates a busy state, as an example.

The bridge chip enable signal BRG_CEn is activated at the time of transmission of a control command for the bridge chip BC. During an active state of the bridge chip enable signal BRG_CEn, receiving information such as command, data accompanying the command, etc., the bridge chip BC interprets the information as the one addressed to itself. In addition, during the active state of the bridge chip enable signal BRG_CEn, the bridge chip BC does not transfer the signal, receiving from the host HA, to any memory chip CP. During an inactive state of the bridge chip enable signal BRG_CEn, the bridge chip BC transfers the signal, if receiving from the host HA, to the memory chip CP to be accessed.

The chip enable signal CEn is for setting an enable state of the memory chip CP to be accessed. The data strobe signal DQS/DQSn is for instructing the counterpart device to fetch data transmitted by the data signal DQ[7:0]. The data strobe signal DQS/DQSn serves as a differential signal including a data strobe signal DQS and a data strobe signal DQSn. The command latch enable signal CLE indicates that the data signal DQ[7:0] is a command. The address latch enable signal ALE indicates that the data signal DQ[7:0] is an address. The write enable signal WEn is for instructing the counterpart device to fetch the command or address transmitted by the data signal DQ[7:0]. The read enable signal RE/REn is for instructing the counterpart device to output the data signal DQ[7:0]. The read enable signal RE/REn serves as a differential signal including a read enable signal RE and a read enable signal REn. Receiving the read enable signal RE/REn, the counterpart device can generate the data strobe signal DQS/DQSn by delaying the read enable signal RE/REn. The ready/busy signal R/Bn indicates a ready state (R), i.e., a standby state for reception of a command, or a busy state (Bn) in which a received command is non-executable. As an example, the channel CH0 includes a signal line for transferring a ready/busy signal R/Bn_1 as a ready/busy signal R/Bn for the channel CH1 and a signal line for transferring a ready/busy signal R/Bn_2 as a ready/busy signal R/Bn for the channel CH2. The configuration of the signal line of the channel CH0 for transferring the ready/busy signal R/Bn is not limited to the above example. For example, the channel CH0 may include one signal line for transferring one ready/busy signal R/Bn generated through wired connection from two ready/busy signals R/Bn for the channel CH1.

Hereinafter, the period in which the bridge chip BC is interrupted from transferring the signal received from the host HA to the memory chip CP and interprets the received signal as the signal addressed to the bridge chip BC is referred to as a bridge control period. A period other than the bridge control period is referred to as a non-bridge control period. An operation mode of the bridge chip BC in the non-bridge control period, i.e., in which the bridge chip BC receives and transfers the signal from the host HA to the memory chip CP, is an example of a first mode. An operation mode during the bridge control period, that is, in which the bridge chip BC receives and refrains from transferring the signal from the host HA to the memory chip CP but executes the signal, is an example of a second mode.

Each of the channels CH1 and CH2 can transmit and receive the same signal groups except for the bridge chip enable signal BRG_CEn among signal groups transmitted and received between the host HA and the bridge chip BC. That is, each of the channels CH1 and CH2 includes the signal line for transferring the chip enable signal CEn, the signal line for transferring the command latch signal CLE, the signal line for transferring the address latch signal ALE, the signal line for transferring the write enable signal WEn, the signal line for transferring the read enable signal RE/REn, the signal line for transferring the data strobe signal DQS/DQSn, the signal line for transferring the data signal DQ[7:0], and the signal line for transferring the ready/busy signal R/Bn.

The memory chips CP1-1 to CP1-4 are commonly connected to the channel CH1. The memory chips CP2-1 to CP2-4 are commonly connected to the channel CH2. Part of the signal lines constituting the channels CH1 and CH2 may not be commonly connected to the memory chips. For example, the memory chips CP1-1 to CP1-4 and CP2-1 to CP2-4 may be individually connected to a controller 101 via the signal line for transferring the chip enable signal CEn.

The bridge chip BC includes the controller 101, a buffer memory 102, and a channel interface 103.

The buffer memory 102 temporarily stores or buffers transfer data between the host HA and the memory chip CP. The buffer memory 102 can include, for example, a dynamic random access memory (DRAM) or a static random access memory (SRAM). The type of memory constituting the buffer memory 102 is not limited to such an example.

The channel interface 103 communicates information with the memory chip CP via the channels CH1 and CH2. The channel interface 103 receives a command, an address, or data from the controller 101 and transfers it to the memory chip CP via the channels CH1 and CH2, and receives and stores data from the memory chip CP in the buffer memory 102 and supplies the data to the controller 101, for example.

For example, the channel interface 103 can supply the chip enable signal CEn, the command latch enable signal CLE, the address latch enable signal ALE, the write enable signal WEn, and the data signal DQ[7:0] input to the external terminal group 10, to the memory chip CP via the channels CH1 and CH2.

To cause the memory chip CP to output data, the channel interface 103 supplies the read enable signal RE/REn to the memory chip CP concerned via a channel. The memory chip CP outputs data being the data signal DQ[7:0] and generates the data strobe signal DQS/DQSn from the read enable signal RE/REn. The channel interface 103 can fetch the data at timing based on the data strobe signal DQS/DQSn.

The data fetched by the channel interface 103 is stored in the buffer memory 102. The buffer memory 102 outputs the data signal DQ[7:0] to the host HA at timing in response to the read enable signal RE/REn from the host HA. At the same time the controller 101 generates the data strobe signal DQS/DQSn in response to the read enable signal RE/REn from the host HA and supplies the data strobe signal DQS/DQSn to the host HA.

The controller 101 is located between the external terminal group 10 and the channel interface 103. The controller 101 uses the buffer memory 102 to control transmission and reception of information between the external terminal group 10 and the channel interface 103.

The controller 101 includes a command decoder 111, a mask circuit 112, and a register 113.

The command decoder 111 receives a command from the host HA via the external terminal group 10 and analyzes the command. The command decoder 111 can issue a command to the memory chip CP according to a result of the analysis.

The mask circuit 112 is capable of interrupting the supply of a signal to the memory chip CP in response to the bridge chip enable signal BRG_CEn. During the active state of the bridge chip enable signal BRG_CEn, that is, the bridge control period, the mask circuit 112 interrupts the signal supply to the memory chip CP. During the inactive state of the bridge chip enable signal BRG_CEn, that is, the non-bridge control period, the mask circuit 112 transmits the signal to the memory chip CP. That is, the mask circuit 112 implements switching between a first mode and a second mode in accordance with the bridge chip enable signal BRG_CEn.

The register 113 serves as a memory to which various types of information (referred to as operation control information) for controlling the operation of the bridge chip BC is written.

The operation control information is not limited to particular information. For example, the operation control information may be setting information used for controlling the bridge chip BC. The setting information is sent from the host HA and stored in the bridge chip BC. The controller 101 executes an operation according to the setting information. The setting information refers to, for example, size information of transfer data. The size information of transfer data will be described in the second embodiment. The setting information may be a list of address values indicating locations of data to be output. The list of address values indicating the locations of data to be output will be described in the sixth embodiment.

The operation control information may represent status information on the bridge chip BC. In response to an instruction from the host HA, the bridge chip BC performs an operation, such as a read operation, and at the time of progressing to a given point, writes progress information indicating the progress to the register 113 as status information. The host HA can know the state of progress of the operation, referring to the status information in the register 113, and determine timing for giving an instruction as to a next operation to the memory chips CP. Exemplary progress information will be described in the third embodiment.

To write the operation control information to the register 113, the host HA can use an existing register write command for the memory chip, for example, a Set Feature command. To read the operation control information from the register 113, the host HA can use an existing register read command for the memory chip, for example, a Get Feature command. To read the status information from the register 113, the host HA may use an existing read command for reading the status information from the memory chip, for example, a Read Status command.

The host HA places the bridge chip enable signal BRG_CEn in the active state in advance at the time of accessing the register 113. As a result, no access commands for the register 113 are supplied to the memory chip CP.

Each of the memory chips CP includes a memory cell array 201, a peripheral circuit 202, and a page buffer 203.

The memory cell array 201 includes a plurality of blocks. Each block is an aggregation of non-volatile memory cell transistors. Each memory cell transistor is associated with a row and a column and can store data. The entire data stored in one block can be erased at the same time.

In a read operation or a write operation with respect to the memory cell array 201, a group of memory cell transistors sharing a row is collectively selected to execute the read operation and the write operation to the selected group of memory cell transistors at the same time. The minimum unit of the read operation and the write operation with respect to the memory cell array 201 is referred to as a page. In the case of each memory cell transistor capable of storing 1-bit data, a group of memory cell transistors sharing a row has a storage capacity of one page. In the case of each memory cell transistor capable of storing two or more bit data, a group of memory cell transistors sharing a row has a storage capacity of two or more pages.

The memory cell array 201 is connected to the peripheral circuit 202 via the page buffer 203.

The peripheral circuit 202 includes a row decoder, a column decoder, a sense amplifier, a sequencer, a command register, an address register, a status register, and a feature register. The peripheral circuit 202 is located around the memory cell array 201 and electrically connected to the channel. The peripheral circuit 202 uses the page buffer 203 to control an access operation, such as a read operation or a write operation, to each memory cell of the memory cell array 201, in response to a command from the bridge chip BC via the channel.

The page buffer 203 serves to transfer data between the channel and the memory cell array 201. The peripheral circuit 202 reads data from the memory cell array 201 in response to a Page Read command from the bridge chip BC, and temporarily stores the data in the page buffer 203. Thus, the page buffer 203 has a storage capacity corresponding to the minimum unit of the read operation to the memory cell array 201, that is, one page. The data read operation to the memory cell array 201 and data storing in the page buffer 203 are referred to as sensing.

The peripheral circuit 202 supplies the data from the page buffer 203 to the bridge chip BC in response to a Data Output command from the bridge chip BC.

Figure 3:
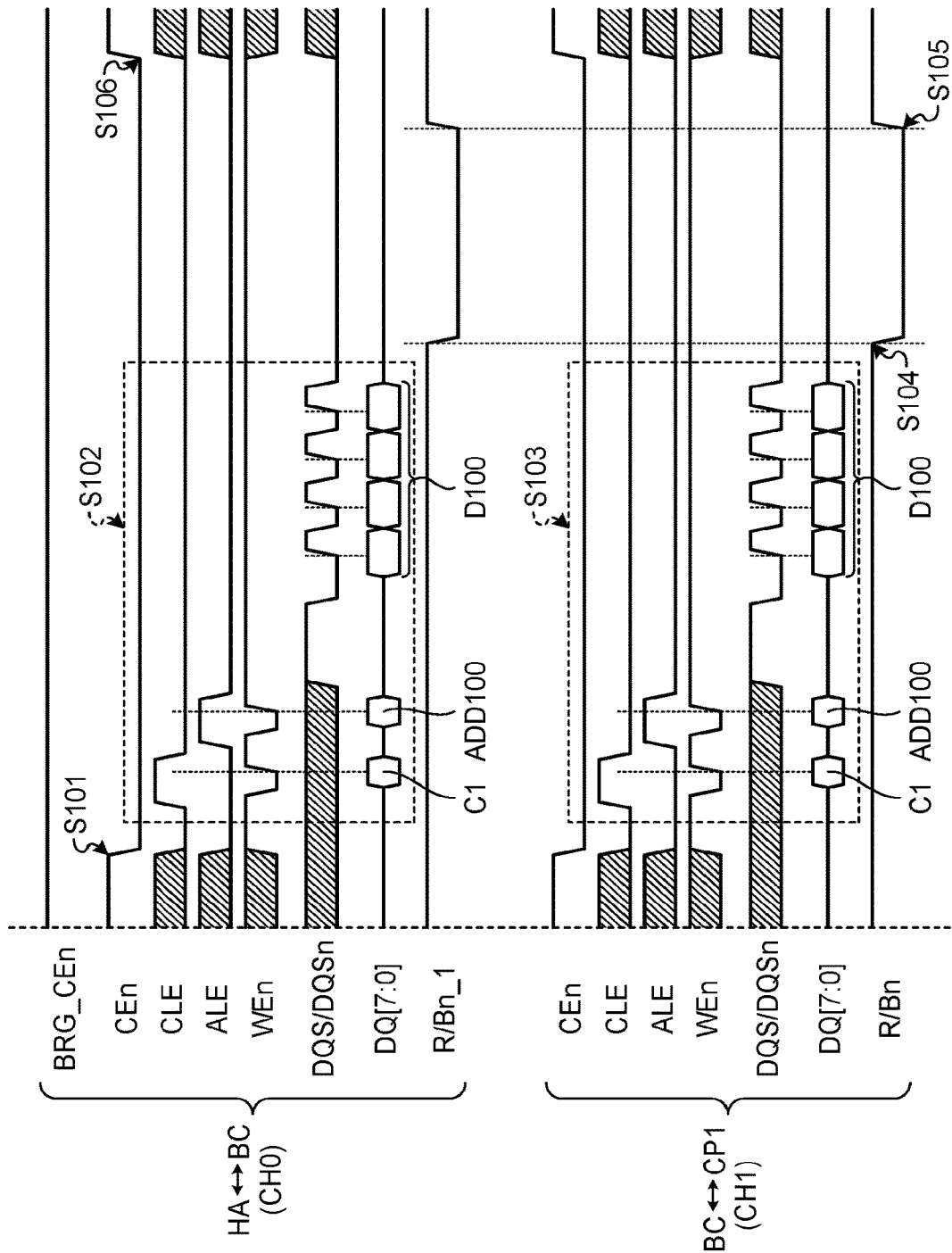
FIG. 3 is a timing chart illustrating an operation of the semiconductor device according to the first embodiment when a host transmits a command addressed to a memory chip to a bridge chip.

The following will describe an operation of the semiconductor device 1 according to the first embodiment. FIG. 3 is a timing chart illustrating an operation of the semiconductor device 1 according to the first embodiment when the host HA transmits a command, addressed to the memory chip CP, to the bridge chip BC. The command addressed to the memory chip CP is exemplified by a Set Feature command. It is assumed that a certain memory chip CP1 connected to the channel CH1 is the destination.

The host HA maintains the bridge chip enable signal BRG_CEn in the inactive state or H-level in transmitting the command addressed to the memory chip CP, in other words, the command that is not addressed to the bridge chip BC. In the example illustrated in FIG. 3, the memory chip CP1 is the destination of the Set Feature command, so that the host HA maintains the bridge chip enable signal BRG_CEn in the inactive state or H-level.

The host HA allows the chip enable signal CE in the channel CH0 to transition to the active state or L-level (S101).

Thereafter, the host HA transmits the Set Feature command (S102). Specifically, the host HA transmits a command value C1 representing the Set Feature command, an address value ADD100 representing an access destination, and data D100 to be written in this order. In transmitting the command value C1, the host HA maintains the command latch enable signal CLE in the active state (H-level), and toggles the write enable signal WEn. In transmitting the address value ADD100, the host HA maintains the address latch enable signal ALE in the active state (H-level) and toggles the write enable signal WEn. In transmitting the data D100, the host HA toggles the data strobe signal DQS/DQSn.

Since the bridge chip enable signal BRG_CEn is maintained in the inactive state or H-level, the mask circuit 112 of the bridge chip BC transfers a signal from the host HA to the memory chip group CP. Thus, the Set Feature command is supplied from the host HA to the bridge chip BC in S102 and directly transferred from the bridge chip BC to the channel CH1 (S103).

In the destination memory chip CP1, the peripheral circuit 202 receives the Set Feature command including the command value C1, the address value ADD100, and the data D100 via the channel CH1. The peripheral circuit 202 executes an operation in accordance with the received Set Feature command. That is, the peripheral circuit 202 writes the received data D100 to a location indicated by the address value ADD100 in its feature register. At the time of starting an operation in response to the Set Feature command, the peripheral circuit 202 causes the ready/busy signal R/Bn of the channel CH1 to transition to the busy state or L-level (S104). After completion of the operation by the Set Feature command, the peripheral circuit 202 returns the ready/busy signal R/Bn of the channel CH1 to the ready state (S105). The ready/busy signal R/Bn of the channel CH1 is directly transferred via the bridge chip BC to the host HA as the ready/busy signal R/Bn_1 of the channel CH0.

From the ready/busy signal R/Bn_1 returning from the busy state to the ready state, the host HA recognizes completion of the execution of the Set Feature command, and causes the chip enable signal CE of the channel CH0 to transition to the inactive state or H-level (S106).

In this manner, the host HA maintains the bridge chip enable signal BRG_CEn in the inactive state at the time of transmitting the command to any of the memory chips CP. The bridge chip BC allows the command from the host HA to transmit through the channels CH1 and CH2 in the inactive state of the bridge chip enable signal BRG_CEn. Thus, the destination memory chip CP can receive the command addressed to itself.

Figure 4:
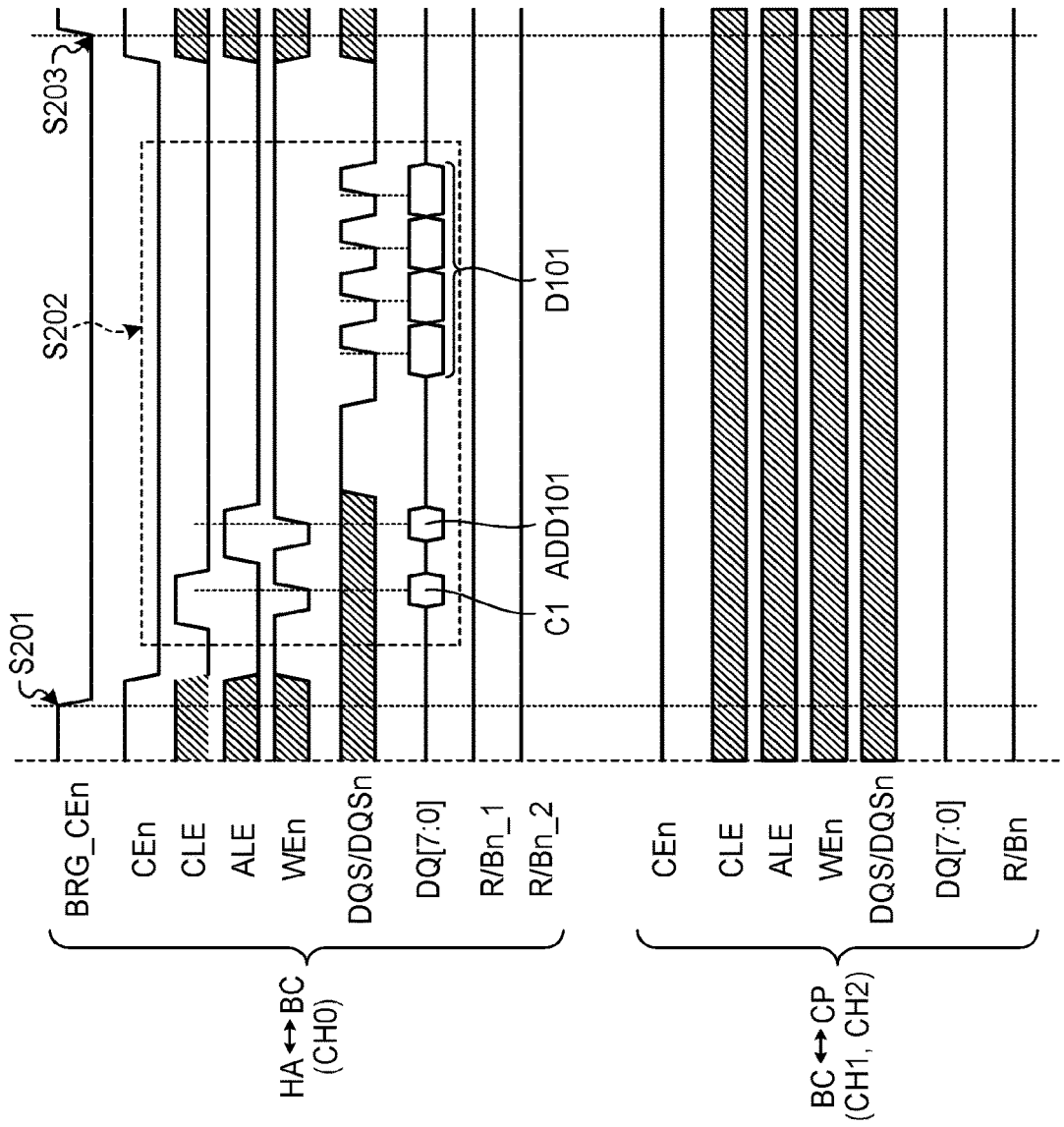
FIG. 4 is a timing chart illustrating an operation of the semiconductor device according to the first embodiment when the host transmits a command to the bridge chip.

FIG. 4 is a timing chart illustrating an operation of the semiconductor device 1 according to the first embodiment when the host HA transmits the command addressed to the bridge chip BC. The command addressed to the bridge chip BC is exemplified by a Set Feature command.

The host HA maintains the bridge chip enable signal BRG_CEn in the active state or L-level, in transmitting the command addressed to the bridge chip BC. In this example, the bridge chip BC is the destination of the Set Feature command, so that the host HA causes the bridge chip enable signal BRG_CEn to transition to the active state or L-level (S201). This starts the bridge control period.

Next, the host HA transmits the Set Feature command (S202). The host HA causes the chip enable signal CEn to transition to the active state or L-level before transmitting the Set Feature command in this example. The host HA may not control the chip enable signal CEn.

A transmission procedure for the Set Feature command is similar to that for the command addressed to the memory chip CP. Specifically, the host HA transmits the command value C1 representing the Set Feature command, an address value ADD101 representing an access destination, and data D101 to be written in this order. In transmitting the command value C1, the host HA maintains the command latch enable signal CLE in the active state or H-level, and toggles the write enable signal WEn. In transmitting the address value ADD101, the host HA maintains the address latch enable signal ALE in the active state or H-level and toggles the write enable signal WEn. In transmitting the data D101, the host HA toggles the data strobe signal DQS/DQSn.

During the bridge control period, the mask circuit 112 of the bridge chip BC refrains from transferring the signal from the host HA to the memory chip CP.

In addition, during the bridge control period, the command decoder 111 of the bridge chip BC interprets the command value C1, the address value ADD101, and the data D101 as the Set Feature command addressed to itself. The controller 101 executes the Set Feature command received in S202. That is, the controller 101 writes the data D101 to a location, indicated by the address value ADD101, in the register 113 of the controller 101.

After completing the transmission of the Set Feature command, the host HA causes the bridge chip enable signal BRG_CEn to transition to the inactive state or H-level (S203). This ends the bridge control period.

In this manner, the host HA maintains the bridge chip enable signal BRG_CEn in the active state, in transmitting the command addressed to the bridge chip BC. The bridge chip BC refrains from transferring the command from the host HA to the channels CH1 and CH2 in the active state of the bridge chip enable signal BRG_CEn. Thus, the command addressed to the bridge chip BC does not reach any memory chip CP.

Suppose that a certain memory chip CP receives the Set Feature command addressed to the bridge chip BC for writing an address. In such a case the memory chip CP may perform a write operation in response to the Set Feature command even though the memory chip CP does not incorporate the register. While executing a standard-defined operation, even if it is a write operation to a non-existing address, the memory chip CP maintains the ready/busy signal R/Bn in the busy state, and sends the ready/busy signal R/Bn to the host HA via the channel CH0. It is not possible for the host HA to transmit a next command via the channel CH0 in the busy state of the ready/busy signal R/Bn in the channel CH0.

According to the first embodiment, the bridge chip BC is configured to be able to switch between a first mode and a second mode in accordance with the bridge chip enable signal BRG_CEn. The first mode is an operation mode during the non-bridge control period in which the bridge chip BC receives and transfers the command from the host to the memory chip CP. The second command is an operation mode during the bridge control period in which the bridge chip BC does not transfer the received command to the memory chip CP but executes the operation according to the command.

The host HA can prevent the command addressed to the bridge chip BC from reaching the memory chip CP, by using the bridge chip enable signal BRG_CEn. This makes it possible to avoid the memory chip CP from operating by the command addressed to the bridge chip BC and prevent the occurrence of a time for the host HA to wait for the completion of the operation of the memory chip CP. The host HA promptly transmits a next command to the memory chip CP after transmitting the command addressed to the bridge chip BC, which enables improvement in data transfer rate between the host HA and the memory chips CP.

In the first embodiment the external terminal group 10 includes a dedicated terminal for receiving the bridge chip enable signal BRG_CEn.

First Modification

In the first embodiment described above, the bridge chip enable signal BRG_CEn serves as the specific signal for controlling the bridge control period. The specific signal for controlling the bridge control period is not limited thereto.

For example, the specific signal for controlling the bridge control period can be a vendor specific command. In a first modification, a bridge control command is defined as one of the vendor specific commands. That is, in the first modification the bridge control command corresponds to the specific signal for controlling the bridge control period. In the first modification, the channel CH0 has a configuration excluding the bridge chip enable signal BRG_CEn, unlike the channel CH0 of the first embodiment. Thus, the channel CH0 conforms to the standard.

The controller 101 includes a signal line for an internal bridge chip enable signal IBRG_CEn. The internal bridge chip enable signal IBRG_CEn exerts the same or like effects on the mask circuit 112 as the bridge chip enable signal BRG_CEn. For example, the internal bridge chip enable signal IBRG_CEn is stored, for example, in the register 113. The internal bridge chip enable signal IBRG_CEn is input to the mask circuit 112 via the signal line. During the active state or L-level of the internal bridge chip enable signal IBRG_CEn, the mask circuit 112 interrupts the supply of the signal to the memory chip CP. During the inactive state or H-level of the internal bridge chip enable signal IBRG_CEn, the mask circuit 112 allows the signal to the memory chip CP to transmit therethrough. The active state or L-level period of the internal bridge chip enable signal IBRG_CEn corresponds to the bridge control period.

After interpreting the received command from the host HA as the bridge control command, the command decoder 111 causes the internal bridge chip enable signal IBRG_CEn to transition to the active state or L-level. In response to the transition of the chip enable signal CEn of the channel CH0 from the active state or L-level to the inactive state or H-level during the active state or L-level of the internal bridge chip enable signal IBRG_CEn, the controller 101 causes the internal bridge chip enable signal IBRG_CEn to transition from the active state or L-level to the inactive state or H-level.

Figure 5:
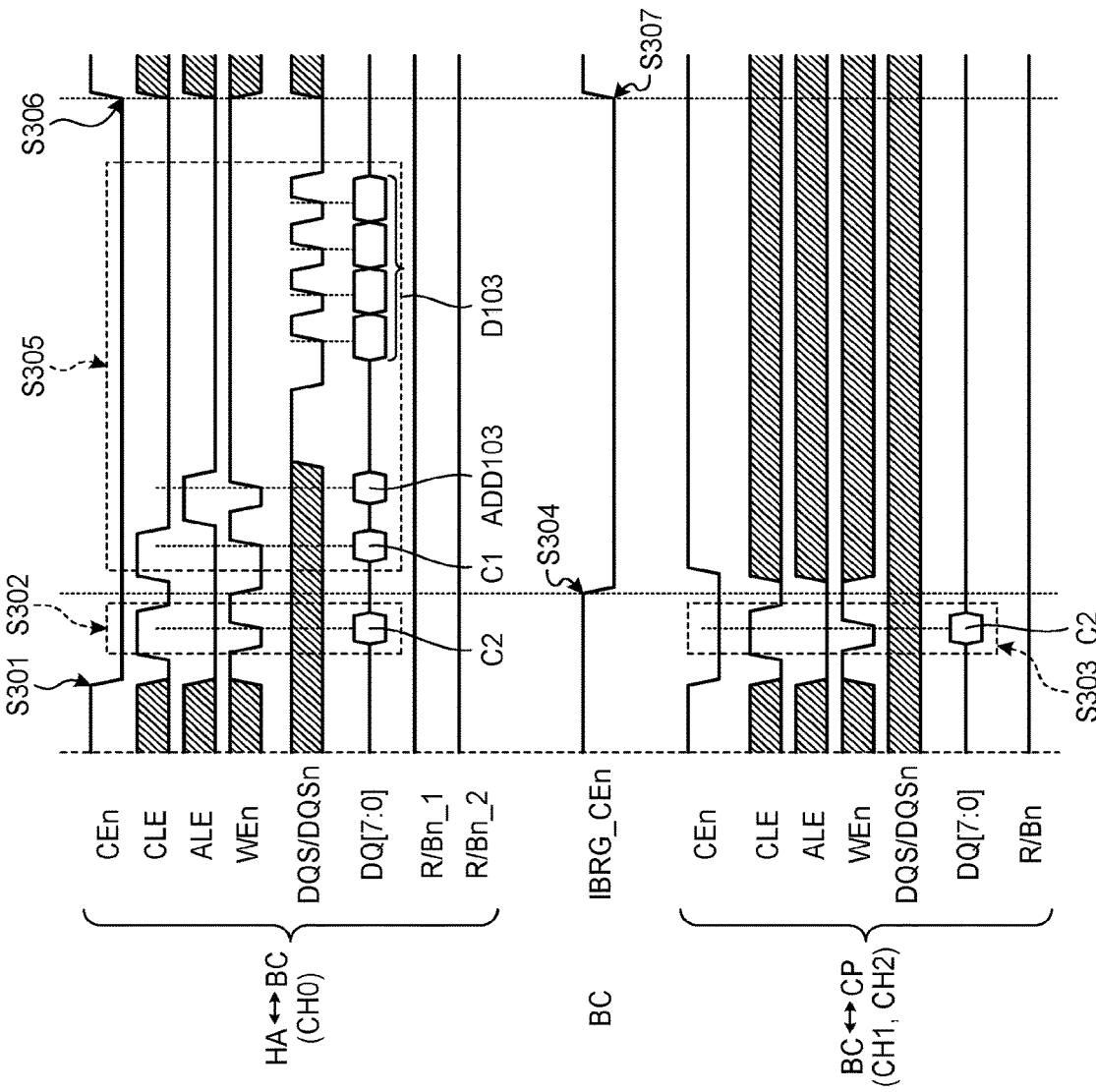
FIG. 5 is a timing chart illustrating an operation of a semiconductor device according to a first modification when a host transmits a command to a bridge chip.

FIG. 5 is a timing chart illustrating an operation of the semiconductor device 1 according to the first modification when the host HA transmits the command addressed to the bridge chip BC. The command addressed to the bridge chip BC is exemplified by a Set Feature command.

According to the first modification, the host HA causes the chip enable signal CEn to transition to the active state or L-level regardless of whether the bridge chip BC or the memory chip CP is a destination (S301).

The host HA transmits the bridge control command to the bridge chip BC to start the bridge control period (S302). In S302, the host HA transmits a command value C2 representing the bridge control command as the data signal DQ[7:0]. In transmitting the command value C2, the host HA maintains the command latch enable signal CLE in the active state (H-level), and toggles the write enable signal WEn.

The bridge chip BC receives the command value C2, and the command decoder 111 interprets the command value C2 as the bridge control command. The controller 101 then causes the internal bridge chip enable signal IBRG_CEn to transition to the active state or L-level (S304). The mask circuit 112 starts interrupting the supply of the signal from the host HA to the memory chip CP in response to the transition of the internal bridge chip enable signal IBRG_CEn to the active state or L-level. This starts the bridge control period.

Before the start of the bridge control period, the internal bridge chip enable signal IBRG_CEn is in the inactive state or H-level. Thus, the bridge chip BC receives and transfers the bridge control command from the host HA to the memory chip CP via the channels CH0 and CH1 (S303). That is, the memory chip CP receives the bridge control command. The command value C2 is selected from values unused by the standard and unused for vendor specific commands for the memory chip CP. The memory chip CP is required to simply discard such an undefined command upon receipt without performing any operation. That is, the memory chip CP does not start any operation in response to receipt of the command value C2.

After the start of the bridge control period, the host HA transmits the Set Feature command, as in the first embodiment illustrated in FIG. 4 (S305). Specifically, the host HA sequentially transmits the command value C1 representing the Set Feature command, an address value ADD103 representing an access destination, and data D103 to be written.

During the bridge control period, the controller 101 of the bridge chip BC interprets the command supplied from the host HA (in this case, the Set Feature command) as a command addressed to itself. The command decoder 111 interprets the received command as the Set Feature command. The controller 101 executes an operation in accordance with the Set Feature command. That is, the controller 101 writes the data D103 to a location indicated by the address value ADD103 in the corresponding register 113.

During the bridge control period, the Set Feature command transmitted from the host HA does not reach the memory chip CP. The memory chip CP will not execute any operation in response to the Set Feature command addressed to the bridge chip BC.

After completing the transmission of the Set Feature command, the host HA causes the chip enable signal CE to transition to the inactive state or H-level (S306). Then, the controller 101 of the bridge chip BC causes the internal bridge chip enable signal IBRG_CEn to transition to the inactive state or H-level. This ends the bridge control period. After the end of the bridge control period, the bridge chip BC can transfer the command from the host HA to the memory chip CP.

The operation of the semiconductor device 1 according to the first modification in response to transmission of the command addressed to the memory chip CP from the host HA to the bridge chip BC is equivalent to the operation of the first embodiment with reference to the timing chart in FIG. 3 except for the bridge chip enable signal BRG_CEn replaced with the internal bridge chip enable signal IBRG_CEn. FIG. 5 thus omits illustrating the operation of the semiconductor device 1 according to the first modification in response to transmission of the command addressed to the memory chip CP from the host HA to the bridge chip BC.

According to the first modification, as described above, the bridge control command, i.e., the specific command for the bridge chip BC to start the bridge control period is prepared. It is made possible to control the bridge control period by assigning only one of command values assignable by the memory vendor to the bridge control command.

The first embodiment and the first modification have described the Set Feature command as an example of the command used by the host HA during the bridge control period. The bridge chip BC can be configured to be able to execute any register access command during the bridge control period, in addition to the Set Feature command. For example, in response to receiving a Get Feature command during the bridge control period, the bridge chip BC can supply data from the register 113 to the host HA. In response to receiving a Read Status command during the bridge control period, the bridge chip BC can supply the status information from the register 113 to the host HA.

The commands executable by the bridge chip BC during the bridge control period are not limited to the Set/Get Feature command and the Read Status command. The bridge chip BC can be configured to be able to execute any command during the bridge control period.

Further, the commands executable by the bridge chip BC during the bridge control period can be freely defined without restriction by a particular standard. For example, the bridge chip BC may be configured to be able to use a specifically defined command during the bridge control period. The access commands for the register 113 during the bridge control period are not limited to the above commands, such as the Set/Get Feature command and the Read Status command, prepared by the standard, and may be specifically defined. In addition, the access commands for the register 113 during the bridge control period may be ones diverted from any command prepared by the standard.

In the bridge control period, no command reaches the memory chip CP. Thus, the address space (referred to as a first address space) provided from the semiconductor device 1 to the host HA during the bridge control period may be different from the address space (referred to as a second address space) provided during the period other than the bridge control period, that is, during which the bridge chip BC transmits the command.

For example, the storage area provided by the buffer memory 102 of the bridge chip BC and the storage area provided by the register 113 of the bridge chip BC are mapped to the first address space. The storage area provided by the memory chip CP may not be mapped to the first address space. The storage area provided by the memory chip CP is mapped to the second address space. The storage area provided by the bridge chip BC may not be mapped to the second address space.

Further, the first embodiment requires no command values that the memory vendor can assign. According to the first modification, only one of the command values that the memory vendor can assign may be assigned to the control command for the bridge control period.

That is, according to the first embodiment and the first modification, the control command for the bridge chip BC can be designed in a higher degree of freedom with substantially no use of command values that the memory vendor can assign.

According to the first embodiment and the first modification, as described above, no command reaches the memory chip CP during the bridge control period. Thus, the memory chip CP can be prevented from malfunctioning due to the control command for the bridge chip BC, leading to preventing the occurrence of unnecessary waiting time, which would otherwise occur due to the malfunction of the memory chip CP. Thereby, the data transfer rate between the host HA and the memory chips CP can be improved.

According to the first embodiment and the first modification, the external terminal group 10 receives a first signal and a second signal from the host HA. The first signal refers to a signal transferred via the channel CH0 and may include a command, an address, and data. The second signal corresponds to the bridge chip enable signal BRG_CEn or the bridge control command. As described with reference to FIG. 3, the bridge chip BC transmits a third signal corresponding to the first signal to the memory chip CP in response to reception of the first signal. The third signal may be the same as the first signal, or may be a signal generated from the first signal by, for example, the command decoder 111. In response to receiving the second signal before the first signal, the bridge chip BC refrains from transmitting the third signal to the memory chip CP as described with reference to FIGS. 4 and 5.

After receiving the first signal, receiving the second signal and the third signal after the first signal, and receiving a fourth signal after the second signal and the third signal, the bridge chip CP performs a characteristic operation, as will be described below. The first signal, the third signal, and the fourth signal are transferred via the channel CH0 and can include a command, an address, and data. The second signal corresponds to the bridge chip enable signal BRG_CEn or the bridge control command. The bridge chip BC transmits a fifth signal corresponding to the first signal and a sixth signal corresponding to the fourth signal to the memory chip CP. The fifth signal may be the same as the first signal, or may be a signal generated from the first signal by, for example, the command decoder 111. The sixth signal may be the same as the fourth signal or may be a signal generated from the fourth signal by, for example, the command decoder 111.

In the case of the second signal being the bridge control command, the bridge chip CP performs the following characteristic operation. That is, the bridge chip BC transmits the fifth signal corresponding to the first signal to the memory chip CP, transmits a seventh signal corresponding to the bridge control command to the memory chip CP after the fifth signal, and transmits the sixth signal to the memory chip CP after the seventh signal. The seventh signal may be the same as the bridge control command or may be a signal generated from the bridge control command by, for example, the command decoder 111.

Second Embodiment

According to a toggle DDR standard, a Data Output command for causing the memory chip CP concerned is prepared. The Data Output command does not include designation of a size of data to be output. The size of the data to be output is determined by the number of times at which the read enable signal RE/REn, to be transmitted after the Data Output command, is toggled.

In response to receiving the Data Output command from the host, the bridge chip of the semiconductor device voluntarily supplies the read enable signal RE/REn to the memory chip concerned, before receiving the read enable signal RE/REn from the host. As a result, the bridge chip stores the data to be output in advance in the corresponding buffer memory. In response to receipt of the read enable signal RE/REn from the host, the bridge chip supplies the data in question from the buffer memory to the host.

That is, the bridge chip drives the read enable signal RE/REn addressed to the memory chip, and receives the data from the memory chip. Thus, while the bridge chip transmits and receives the read enable signal RE/REn and data to and from the memory chip via one of the channels (for example, the channels CH1 and CH2), the channel CH0 and another one of the channels are available. Thus, during this period, the host can execute access, such as command or data transfer, to the bridge chip or access to another memory chip connected to another channel via the bridge chip. In addition, during this period, the bridge chip can also transmit and receive the read enable signal RE/REn and data to and from another memory chip connected to another channel.

To sufficiently receive data to be output while not knowing the size of the data, the bridge chip is to receive all the pieces of data from the page buffer memory of the memory chip concerned. However, if the data to be output is only part of the data stored in the page buffer memory, the bridge chip ends up with receiving unnecessary data other than the data to be output. Thus, the bridge chip spends extra time to receive unnecessary data, lowering in data transfer rate.

In view of this, according to the second embodiment, the semiconductor device is configured to be able to designate the size of data to be transferred before receiving a data transfer command, such as a Data Output command. The following will describe the semiconductor device of the second embodiment.

The semiconductor device of the second embodiment is referred to as a semiconductor device 1a. The bridge chip BC included in the semiconductor device 1a is referred to as a bridge chip BCa. The same or like elements as those of the first embodiment are denoted by the same reference signs as therein, and they will be briefly described or their description will be omitted.

The second embodiment can be applied together with the first embodiment or the first modification of the first embodiment. Herein, the second embodiment is applied together with the first embodiment as an example.

Figure 6:
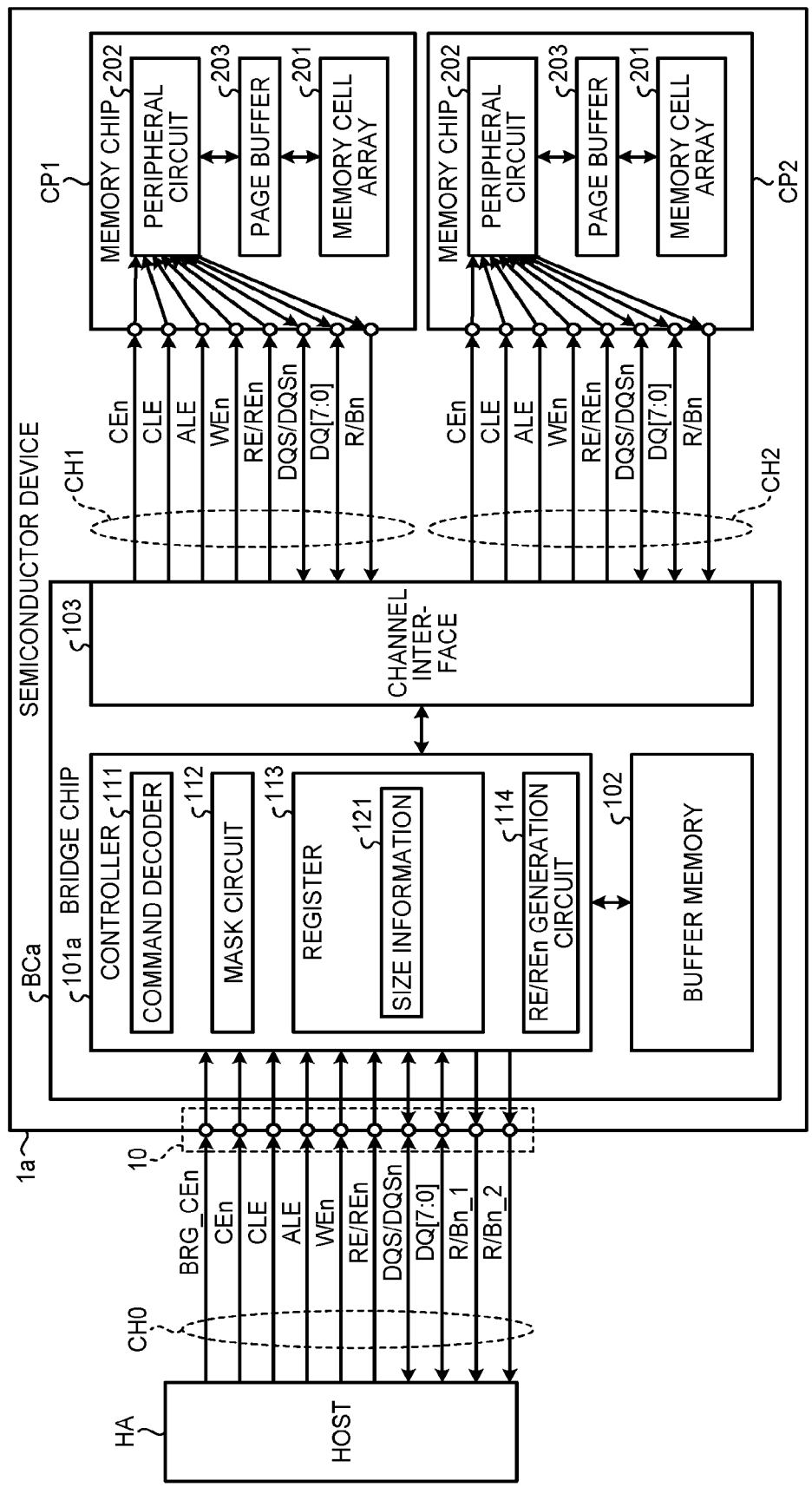
FIG. 6 is a schematic diagram illustrating an exemplary configuration of a semiconductor device according to a second embodiment.

FIG. 6 is a schematic diagram illustrating an exemplary configuration of the semiconductor device 1a of the second embodiment. The semiconductor device 1a includes a bridge chip BCa and memory chips CP1-1 to CP1-4 and CP2-1 to CP2-4. FIG. 6 illustrates one memory chip CP1 and one memory chip CP2 as representatives of the memory chips CP2-1 to CP2-4 and the memory chips CP1-1 to CP1-4, as with FIG. 2.

Each of the memory chips CP includes a memory cell array 201, a peripheral circuit 202, and a page buffer 203.

The bridge chip BCa includes a controller 101a, a buffer memory 102, and a channel interface 103. The controller 101a includes a command decoder 111, a mask circuit 112, a register 113, and a RE/REn generation circuit 114.

Size information 121 from the host HA can be stored in the register 113. The size information 121 is stored in the register 113 during a bridge control period. The host HA instructs the bridge chip BCa to write the size information 121 to the register 113 by a given command, for example, a Set Feature command or a specifically defined register write command while maintaining the bridge chip enable signal BRG_CEn in the active state or L-level. In the bridge chip BCa, the command decoder 111 interprets the received command from the host HA as a write command for the size information 121 to the register 113, and the controller 101a then stores the size information 121 in the register 113. When receiving a subsequent Data Output command from the host HA, the command decoder 111 interprets a data size set by the size information 121 as a size of data to be output by the Data Output command.

The RE/REn generation circuit 114 autonomously generates the read enable signal RE/REn in response to reception of the Data Output command from the host HA. The RE/REn generation circuit 114 toggles the read enable signal RE/REn by the number of times corresponding to the size information 121 stored in the register 113. The channel interface 103 supplies the generated read enable signal RE/REn to the memory chip CP to output the data concerned via either of the channels CH1 and CH2.

The Data Output command contains a head position of the data to be output and the bridge chip BCa supplies the Data Output command to the memory chip CP. The number of times at which the read enable signal RE/Ren, to be supplied from the bridge chip BCa to the memory chip CP, is toggled corresponds to the size of the data to be output. Thus, the memory chip CP can identify the data to be output from among pieces of data pre-stored in the page buffer 203 and can supply only the data in question to the bridge chip BCa.

The bridge chip BCa receives and stores the data from the memory chip CP in the buffer memory 102. The host HA supplies the read enable signal RE/REn to the bridge chip BCa. The controller 101a then supplies the data from the buffer memory 102 to the host HA as the data signal DQ[7:0] in accordance with the read enable signal RE/REn from the host HA.

Figure 7:
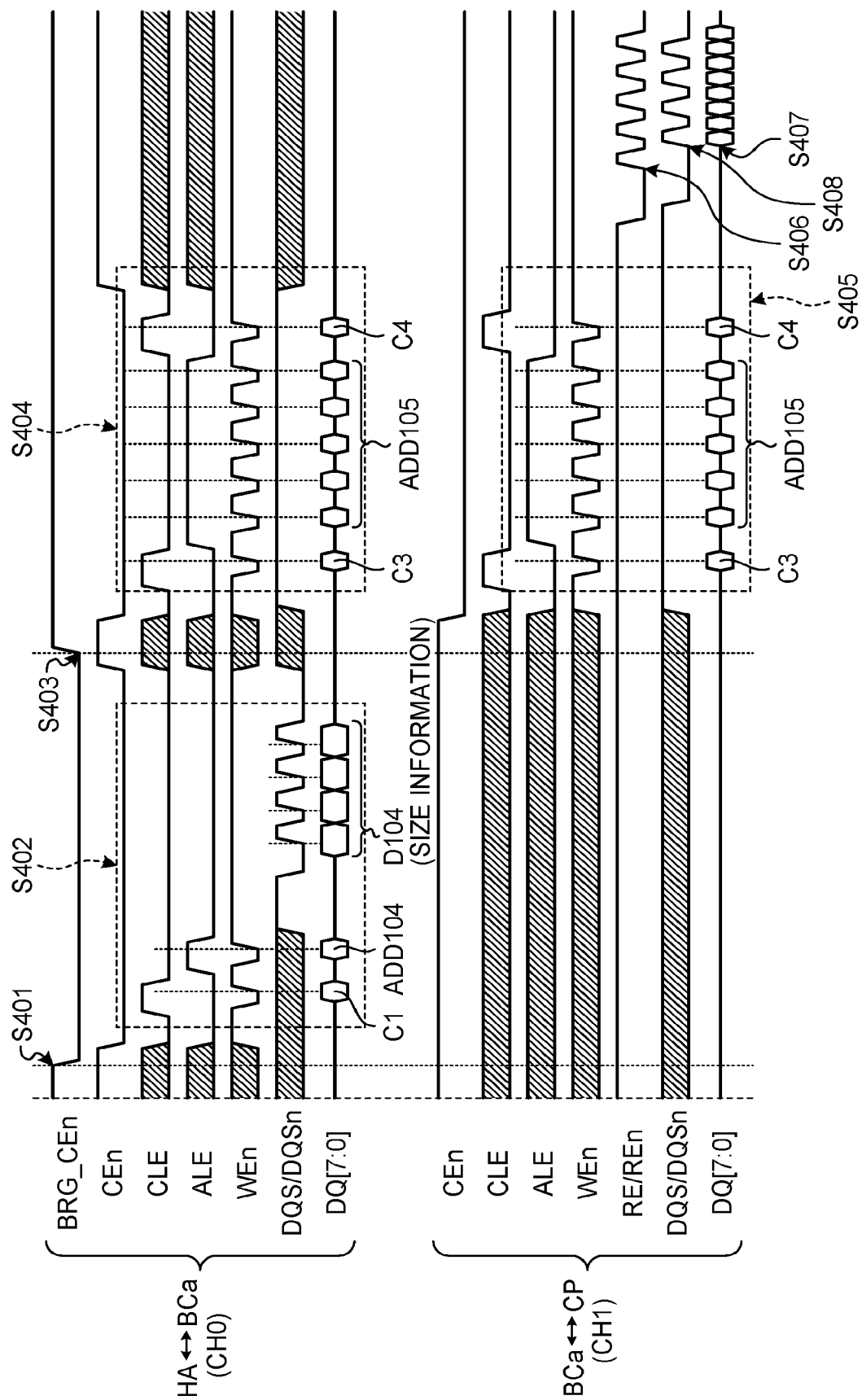
FIG. 7 is a timing chart illustrating an operation of the semiconductor device according to the second embodiment.

FIG. 7 is a timing chart illustrating an operation of the semiconductor device 1a according to the second embodiment. It is assumed that the memory chip CP has stored data containing data to be output in units of 8-bits (that is, a page) in the page buffer 203, in response to receipt of the Page Read command.

First, to transmit the size information 121 to the bridge chip BCa, the host HA causes the bridge chip enable signal BRG_CEn to transition to the active state or L-level (S401). This starts the bridge control period.

Next, the host HA transmits the Set Feature command to the bridge chip BCa to write the size information 121 to the register 113 (S402). The procedure for transmitting the Set Feature command is the same as the procedure in the first embodiment and the first modification. That is, in S402 the host HA transmits the command value C1 representing the Set Feature command, an address value ADD104 representing an access destination, and data D104 to be written in this order. In S402, the size information 121 is transmitted as the data D104 to be written.

The bridge chip enable signal BRG_CEn is maintained in the active state or L-level at the time of transmission of the Set Feature command in S104. The controller 101a of the bridge chip BCa thus interprets the received command as addressed to itself. In addition, the command decoder 111 interprets the received command as the Set Feature command. The controller 101a stores the size information 121 in the register 113 in accordance with the Set Feature command.

After completing the transmission of the Set Feature command, the host HA causes the bridge chip enable signal BRG_CEn to transition to the inactive state or H-level (S403). This ends the bridge control period.

Next, the host HA transmits the Data Output command (S404). In S404 the host HA sequentially transmits a command value C3 of a command value pair C3 and C4 representing the Data Output command, an address value ADD105 representing the head position of the data to be output among the pieces of data stored in the page buffer 203, and the command value C4. At the time of transmitting the command values C3 and C4, the host HA maintains the command latch enable signal CLE in the active state (H-level) and toggles the write enable signal WEn. At the time of transmitting the address value ADD105, the host HA maintains the address latch enable signal ALE in the active state (H-level) and toggles the write enable signal WEn.

The host HA executes the operation in S404 after the end of the bridge control period, therefore, the bridge chip BCa directly supplies the Data Output command transmitted from the host HA in S404 to the memory chip CP concerned (S405).

After receiving the Data Output command, the memory chip CP being the destination of the Data Output command, that is, the one to output data, prepares for outputting data from a location designated by the address value ADD105 among the pieces of data stored in the page buffer 203.

The RE/REn generation circuit 114 of the bridge chip BCa generates the read enable signal RE/REn. The read enable signal RE/REn is supplied from the channel interface 103 to the memory chip CP concerned (S406).

Figure 8:
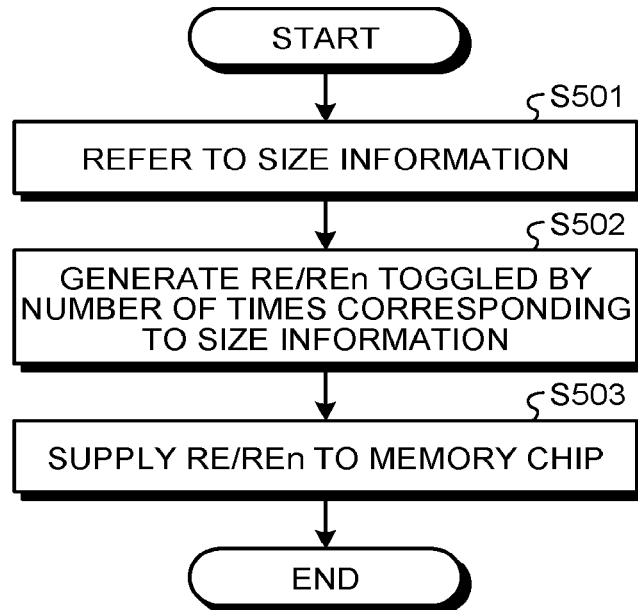
FIG. 8 is a flowchart illustrating details of an operation in S406 according to the second embodiment.

FIG. 8 is a flowchart illustrating the operation in S406 in detail in the second embodiment. First, the RE/REn generation circuit 114 refers to the size information 121 stored in the register 113 (S501). Then, the RE/REn generation circuit 114 generates the read enable signal RE/REn that has been toggled by the number of times corresponding to the size information 121 (S502). The channel interface 103 supplies the generated read enable signal RE/REn to the memory chip CP concerned (S503). This ends the operation.

Referring back to FIG. 7, after start of the supply of the read enable signal RE/REn from the bridge chip BCa, the peripheral circuit 202 in the memory chip CP concerned sequentially outputs data from the page buffer 203 as the data signal DQ[7:0], starting from the data at the location designated by the address value ADD105 (S407). In S407, the peripheral circuit 202 sequentially outputs data in units of 8-bits in synchronization with the toggling of the read enable signal RE/REn.

The peripheral circuit 202 toggles the data strobe signal DQS/DQSn every time it outputs 8-bit data (S408). The peripheral circuit 202 generates the data strobe signal DQS/DQSn by delaying the read enable signal RE/REn supplied from the bridge chip BCa.

The bridge chip BCa sequentially fetches the data from the memory chip CP concerned at the toggling timing of the data strobe signal DQS/DQSn, and stores the fetched data in the buffer memory 102. As a result, the data to be output is stored in the buffer memory 102. The host HA supplies the read enable signal RE/REn to the bridge chip BCa, and the bridge chip BCa can output the data concerned from the buffer memory 102 to the host HA.

The second embodiment has described the example that the size information 121 represents a set value of the size of the data concerned, specifically, the size of the data to be output from the page buffer 203. Alternatively, the size information 121 may represent a set value of a size of data to be input, specifically, the size of data to be input to the page buffer 203.

In addition, the size information 121 may be individually set for each memory chip CP being access destination or for each channel connected to such a memory chip CP.

According to the second embodiment, thus, the size information 121 represents the set value of the size of the data to be input or output to or from the page buffer 203.

Thus, the bridge chip BCa can receive only the data to be output from the memory chip CP. The bridge chip BCa can avoid receiving unnecessary data other than the data to be output, thereby eliminating the time taken for receiving unnecessary data and preventing a decrease in data transfer rate.

Second Modification

A second modification of the second embodiment will be described. The bridge chip BCa according to the second modification is configured to be able to write the size information 121 to the register 113 by a specifically defined command. The specifically defined command for writing the size information 121 is referred to as a size setting command. The size setting command can be used during the bridge control period.

Figure 9:
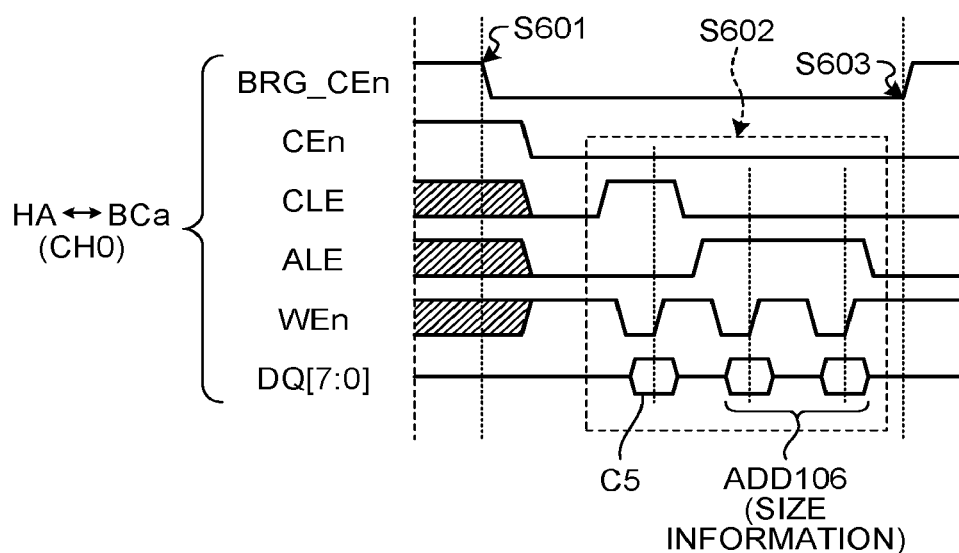
FIG. 9 is a timing chart illustrating an operation of a semiconductor device according to a second modification.

FIG. 9 is a timing chart illustrating an operation of the semiconductor device 1a according to the second modification. It is assumed that the memory chip CP concerned has stored data containing data to be output in a unit of reading (that is, a page) in the page buffer 203, in response to receipt of the Page Read command.

First, to transmit the size information 121 to the bridge chip BCa, the host HA causes the bridge chip enable signal BRG_CEn to transition to the active state or L-level (S601). This starts the bridge control period.

Next, the host HA transmits the size setting command to the bridge chip BCa to write the size information 121 to the register 113 (S602). In S602 the host HA transmits a command value C5 representing the size setting command and an address value ADD106 in this order. In transmitting the command value C5, the host HA maintains the command latch enable signal CLE in the active state (H-level) and toggles the write enable signal WEn. In transmitting the address value ADD106, the host HA maintains the address latch enable signal ALE in the active state or H-level and toggles the write enable signal WEn.

The size setting command is configured to be able to allow transmission of the size information 121 as an address value. That is, the address value ADD106 represents the size information 121. Raw numerical information contained in the size information 121 may be transmitted as an address value. Alternatively, a plurality of pieces of numerical information may be prepared in advance, and the size setting command may be configured to allow selection of one of the pieces of numerical information as the size information 121 depending on an address value.

The bridge chip enable signal BRG_CEn is maintained in the active state or L-level in S602, so that the controller 101a of the bridge chip BCa interprets the received command as addressed to itself. In addition, the command decoder 111 interprets the received command as the size setting command. The controller 101a stores the size information 121 in the register 113 in accordance with the size setting command.

After completing the transmission of the size setting command, the host HA causes the bridge chip enable signal BRG_CEn to transition to the inactive state or H-level (S603). This ends the bridge control period.

Writing the size information 121 is completed in S603. After S603, the semiconductor device 1a executes the operation including transmission of a Data Output command, for example, the operation from S404 to S408 in FIG. 7, as with the second embodiment.

In this manner, the specific command (herein, the size setting command) may be prepared for writing the size information 121.

In the second embodiment and the second modification, the write command for the size information 121 is transmitted after the bridge control period is started by the bridge chip enable signal BRG_CEn. A method of starting the bridge control period is not limited to the method using the bridge chip enable signal BRG_CEn. The bridge chip BCa may be configured to start the bridge control period by a bridge control command.

Further, the write timing of the size information 121 is not limited to the timing immediately before the Data Output command. The size information 121 can be written at any timing. For example, the size information 121 may be written at timing in the middle of a power-on sequence, irrelevant to the Data Output command.

The number of times at which the size information 121 can be used may be fixed. For example, if the size information 121 is usable only once, the controller 101 of the bridge chip BCa may delete or invalidate the size information 121 after use. Alternatively, the size information 121 may be configured to be usable any number of times until being updated or deleted by an instruction from the host HA. The host HA can update or delete the size information 121 by issuing a given command, e.g., a Set Feature command or a specifically defined register write command, during the bridge control period.

In addition, if the register 113 stores no size information 121 or if the size information 121 in the register 113 is invalidated, the bridge chip BCa may interpret the size of data to be output as a page size. The operation in the case of no available size information 121 in the register 113 or size information 121 invalidated in the register 113 is not limited thereto.

Third Embodiment

As described above, the memory chip transmits the data concerned designated by a Data Output command to the bridge chip to be stored in the buffer, and then the bridge chip transfers the data from the buffer to the host. The host may wait for receiving the data concerned from the bridge chip until the bridge chip receives all the pieces of data concerned. In such a case the host is forced to wait for a longer time, lowering the data transfer rate.

In the third embodiment, the bridge chip is configured to be able to start supplying data concerned to the host upon receipt of part of the data.

A semiconductor device according to the third embodiment is referred to as a semiconductor device 1b. The bridge chip according to the third embodiment is referred to as a bridge chip BCb. The same or like elements as those of the first or second embodiment are denoted by the same reference signs as therein, and they will be briefly described or their descriptions will be omitted.

The third embodiment can be applied together with the first embodiment or the first modification of the first embodiment and the second embodiment or the second modification of the second embodiment. Herein, the third embodiment is applied together with the first embodiment and the second embodiment as an example.

Figure 10:
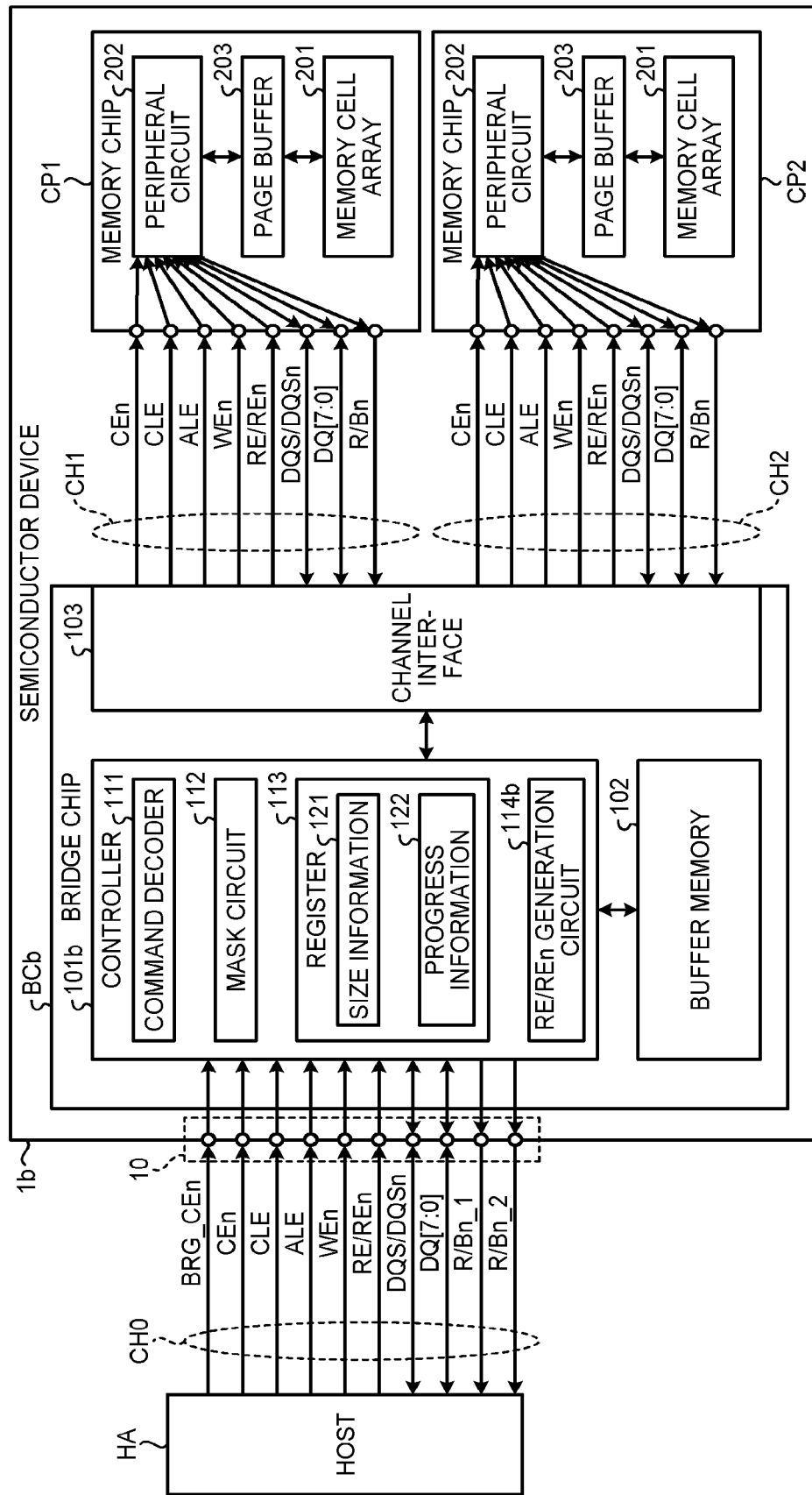
FIG. 10 is a schematic diagram illustrating an exemplary configuration of a semiconductor device according to a third embodiment.

FIG. 10 is a schematic diagram illustrating an exemplary configuration of the semiconductor device 1b according to the third embodiment. The semiconductor device 1b includes the bridge chip BCb and memory chips CP1-1 to CP1-4 and CP2-1 to CP2-4. FIG. 10 illustrates one memory chip CP1 and one memory chip CP2 as representatives of the memory chips CP1-1 to CP1-4 and the memory chips CP2-1 to CP2-4, as with FIG. 2.

In the third embodiment, the channel CH0 connecting the host HA and the bridge chip BCb can be configured to transfer data at a frequency twice as high as the channels CH1 and CH2 connecting the bridge chip BCb and the memory chips CP. In the following, it is assumed that the channel CH0 can transfer data at twice the frequency of the channels CH1 and CH2, by way of example. That is, the channel CH0 can execute data transfer as twice fast as the channels CH1 and CH2.

Each of the memory chips CP includes a memory cell array 201, a peripheral circuit 202, and a page buffer 203.

The bridge chip BCb includes a controller 101b, a buffer memory 102, and a channel interface 103. The controller 101b includes a command decoder 111, a mask circuit 112, a register 113, and a RE/REn generation circuit 114. Size information 121 received from the host HA can be stored in the register 113.

The RE/REn generation circuit 114 can autonomously generate the read enable signal RE/REn. The RE/REn generation circuit 114 toggles the read enable signal RE/REn by the number of times corresponding to the size information 121 stored in the register 113. The generated read enable signal RE/REn is supplied from the channel interface 103 to the memory chip CP concerned via either of the channels CH1 and CH2.

The controller 101b notifies the host HA of given information (referred to as progress information) in response to an event that the amount of data stored or buffered in the buffer memory 102 out of the data concerned has reached a threshold. Alternatively, the controller 101b may store a value indicating that the amount of data has reached the threshold in the register of the bridge chip BCb, and the host HA may periodically check or poll the value.

A notifying method as to the progress information is not limited to a particular method. In this embodiment the controller 101b notifies the host HA of the progress information via the register 113 as an example. Specifically, the controller 101b can store progress information 122 in the register 113 as one piece of status information. After transmitting the Data Output command, the host HA supplies, to the bridge chip BCb, a given read command for the status information stored in the register 113, such as a Get Feature command, a Read Status command, or a specifically defined register read command. The host HA starts a bridge control period to prevent transmission of the read command for the status information from the register 113 to the memory chip CP. Through repeated reading of the status information, the host HA succeeds in acquiring the progress information 122, if stored in the register 113. Thereby, the controller 101b completes the notification of the progress information 122 to the host HA.

The controller 101b may notify the host HA of the progress information through any of the terminals constituting the external terminal group 10.

The controller 101b further sets a threshold according to the size information 121 and the data transfer rate on each of the channels CH0, CH1, and CH2.

For example, consider that the data transfer rate on the channel CH0 is N times higher than the data transfer rate on the channels CH1 and CH2. In such a case, the controller 101b calculates a data size by multiplying a size of data concerned indicated by the size information 121 by (1−1/N), and set the value to the threshold.

If the set threshold is smaller than the data size calculated by multiplying the size of the data concerned indicated by the size information 121 by (1−1/N), the event that no data remains in the buffer memory 102 may occur. No data stored in the buffer memory 102 means that the host HA is forced to suspend acquiring the data until sufficient amount of data is accumulated in the buffer memory 102. This elongates the time for which the channel CH0 is occupied with the data transfer from the bridge chip BCb to the host HA, decreasing the usage efficiency of the channel CH0 and lowering the data transfer rate between the memory chip CP and the host HA.

Meanwhile, if the threshold is significantly larger than the data size calculated by multiplying the size of the data concerned indicated by the size information 121 by (1−1/N), the host HA waits for a longer time to start acquiring the data concerned. This lowers the data transfer rate between the memory chip CP and the host HA.

In the third embodiment, the threshold is set to the data size calculated by multiplying the size of the data concerned indicated by the size information 121 by (1−1/N). This can prevent the situation that no data remains in the buffer memory 102 after the host HA starts acquiring the data concerned. The host HA can also wait for a less time to start acquiring the data concerned.

Figure 11:
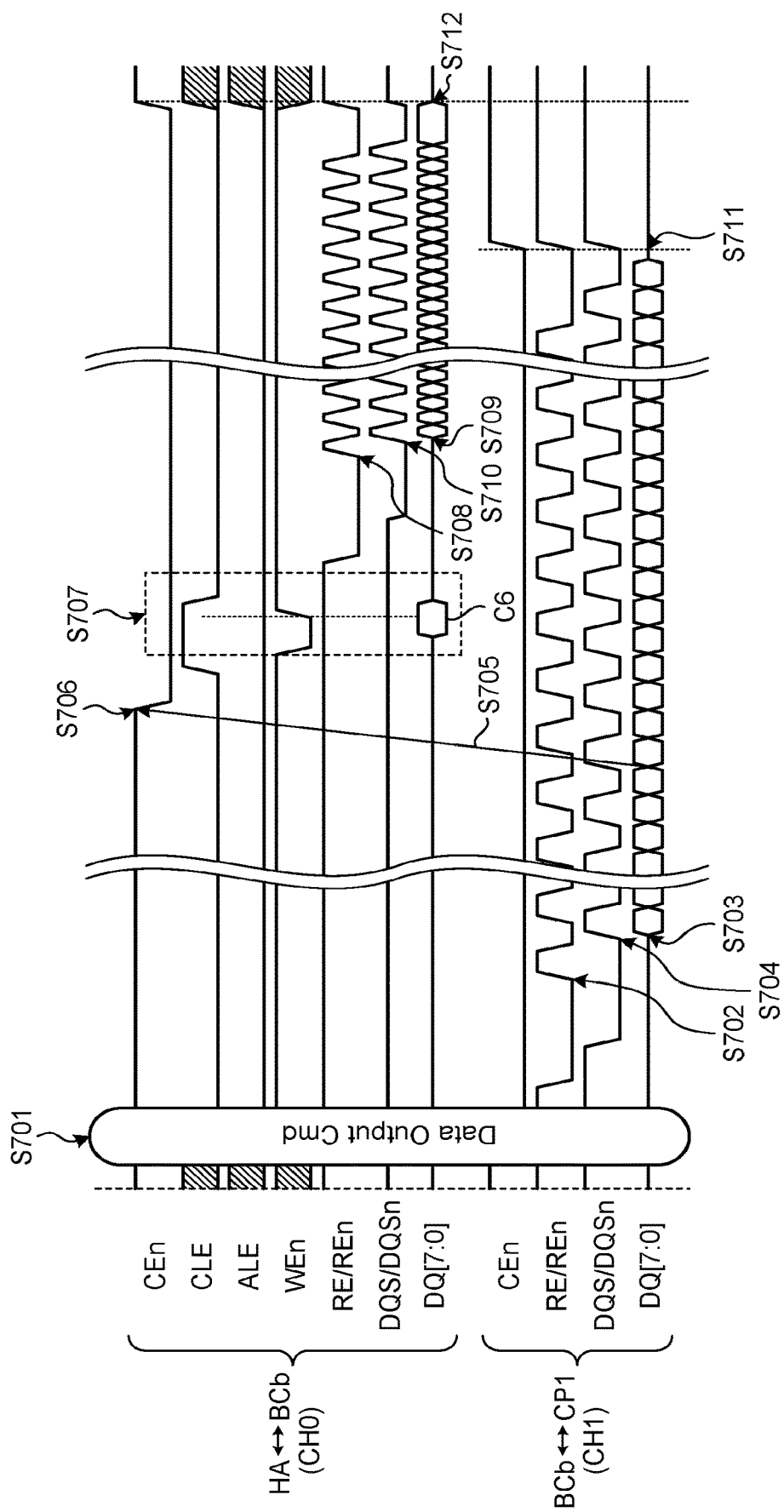
FIG. 11 is a timing chart illustrating an operation of the semiconductor device according to the third embodiment at the time of data transfer from the memory chip to the host via the bridge chip.

Next, an operation of the semiconductor device 1b according to the third embodiment will be described. FIG. 11 is a timing chart illustrating the operation of the semiconductor device 1b according to the third embodiment at the time of data transfer from the memory chip CP to the host HA via the bridge chip BCb. It is assumed herein that the memory chip CP concerned is connected to the channel CH1 as an example. FIG. 11 illustrates an operation of transmitting and receiving a signal between the host HA and the bridge chip BCb and between the bridge chip BCb and the memory chip CP concerned connected to the channel CH1.

First, the host HA transmits the Data Output command (S701). The procedure for transmitting the Data Output command is the same as that in the second embodiment or the second modification. The Data Output command is transmitted from the host HA to the bridge chip BCb and is directly supplied from the bridge chip BCb to the memory chip CP1 concerned.

Next, the RE/REn generation circuit 114 of the bridge chip BCb generates the read enable signal RE/REn. The read enable signal RE/REn is supplied from the channel interface 103 to the memory chip CP1 concerned (S702). The operation in S702 is equivalent to that in S406 of the second embodiment. That is, the read enable signal RE/REn is supplied from the bridge chip BCb to the memory chip CP1 concerned and toggled by the number of times corresponding to the size information 121.

In response to start of the supply of the read enable signal RE/REn from the bridge chip BCb, the peripheral circuit 202 in the memory chip CP1 concerned outputs data from the page buffer 203 as the data signal DQ[7:0], starting from data at a location designated by an address value included in the Data Output command (S703). In S703 the peripheral circuit 202 sequentially outputs data in units of 8-bits in synchronization with the toggling of the read enable signal RE/REn.

In addition, the peripheral circuit 202 toggles the data strobe signal DQS/DQSn every time it outputs 8-bit data (S704). The peripheral circuit 202 generates the data strobe signal DQS/DQSn by delaying the read enable signal RE/REn supplied from the bridge chip BCa.

The bridge chip BCb sequentially fetches the data from the memory chip CP concerned at the toggling timing of the data strobe signal DQS/DQSn, and stores or buffers the fetched data in the buffer memory 102. Then, at the time when the amount of data stored in the buffer memory 102 has reached the threshold, the controller 101b of the bridge chip BCb notifies the host HA of the progress information 122 (S705).

Figure 12:
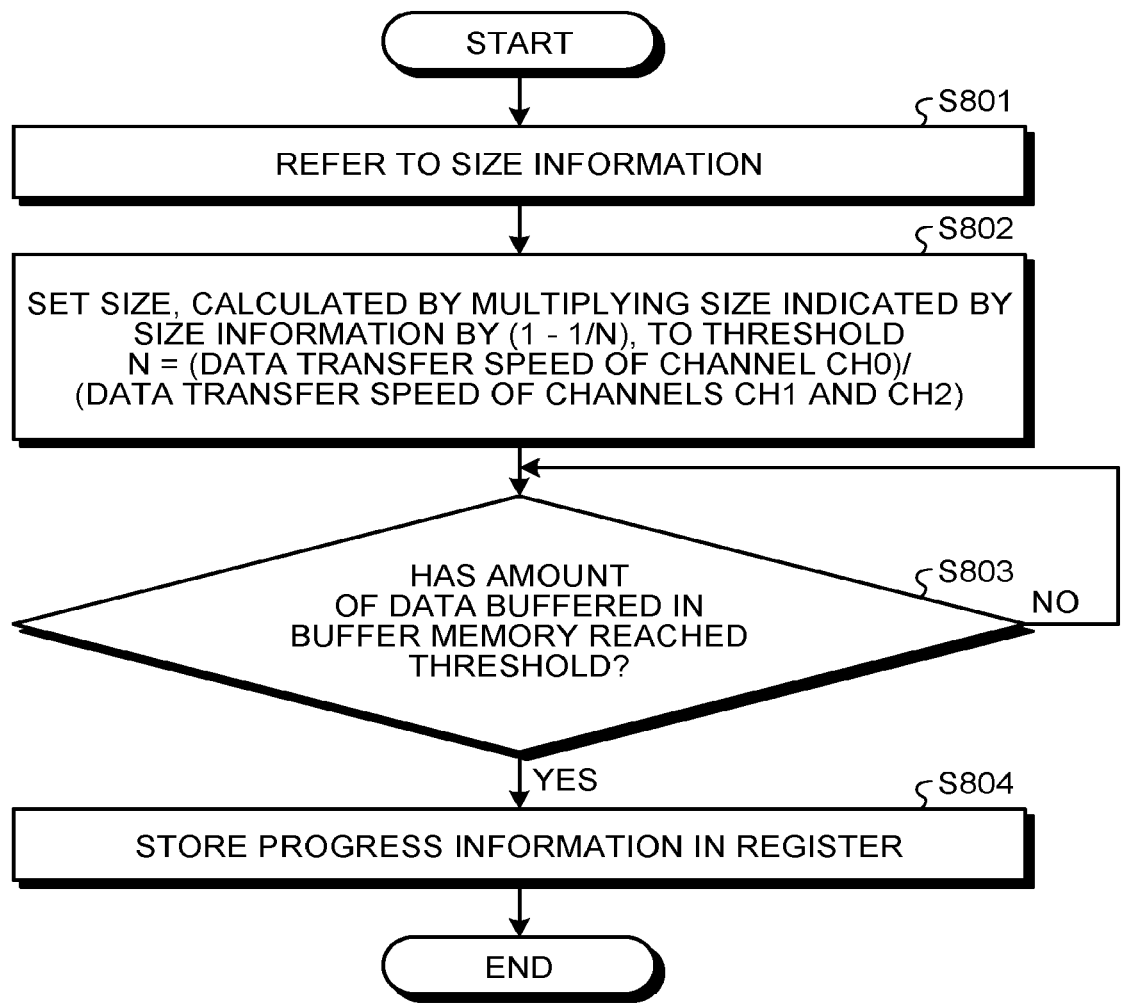
FIG. 12 is a flowchart illustrating details of an operation by the bridge chip for notifying the host of progress information in S705 in the third embodiment.

FIG. 12 is a flowchart illustrating details of a notifying operation as to the progress information 122 (that is, operation in S705 in FIG. 11) by the bridge chip BCb in the third embodiment. First, the controller 101b refers to the size information 121 stored in the register 113 (S801). Then, the controller 101b sets the threshold to the data size calculated by multiplying the size of data to be output indicated by the size information 121 by (1−1/N), where N is a value calculated by dividing the data transfer rate on the channel CH0 by the data transfer rate on the channels CH1 and CH2 (S802). The value N is set to two in this embodiment. The controller 101b thus sets the threshold to the data size calculated by multiplying the size of the data to be output indicated by the size information 121 by ½.

After start of storing data from the memory chip CP concerned in the buffer memory 102 through the operation in S703, the controller 101b determines whether the amount of data buffered in the buffer memory 102 out of the data concerned has reached the threshold (S803).

After determining that the amount of data buffered in the buffer memory 102 has not reached the threshold (No in S803), the controller 101b makes the determination in S803 again. After determining that the amount of data buffered in the buffer memory 102 has reached the threshold (Yes in S803), the controller 101b stores the progress information 122 in the register 113 (S804). This completes the notifying operation as to the progress information 122 by the bridge chip BCb.

Through repeated reading of the status information, the host HA succeeds in acquiring the progress information 122, if stored in the register 113. Thereby, the controller 101b notifies the host HA of the progress information 122.

Referring back to FIG. 11, having acquired the notification as to the progress information 122, the host HA causes the chip enable signal CEn to transition to the active state or L-level (S706) and transmits a command for extracting data from the buffer memory 102 (S707) in order to receive the data concerned from the bridge chip BCb. The operation of S707 is executed during the bridge control period. FIG. 11 omits illustrating an operation of switching the bridge chip enable signal BRG_CEn. In S706 the host HA may cause the bridge chip enable signal BRG_CEn to transition to the active state or L-level instead of the chip enable signal CEn.

The command for extracting the data from the buffer memory 102 may be a specifically defined command. Alternatively, the command for extracting the data from the buffer memory 102 may be any existing command. In S707 the host HA transmits a specifically defined command value C6.

Next, the host HA starts supplying the read enable signal RE/REn to the bridge chip BCb (S708). In S708 the toggle frequency of the read enable signal RE/REn to be supplied from the host HA to the bridge chip BCb is twice higher than that of the read enable signal RE/REn to be supplied from the bridge chip BCb to the memory chip CP. In S708 the host HA toggles the read enable signal RE/REn by the number of times corresponding to the size of the data concerned. In S708 the number of times at which the host HA toggles the read enable signal RE/REn to be supplied to the bridge chip BCb matches the number of times at which the bridge chip BCb toggles the read enable signal RE/REn to be supplied to the memory chip CP concerned in S702.

In response to the host HA's start of supplying the read enable signal RE/REn, the controller 101b of the bridge chip BCb sequentially outputs buffered data from the buffer memory 102 to the host HA as the data signal DQ[7:0] (S709). In S709 the controller 101b sequentially outputs data in units of 8-bits in synchronization with the toggling of the read enable signal RE/REn. That is, the bridge chip BCb transfers data to the host HA at the rate twice higher than the data transfer rate from the memory chip CP concerned to the bridge chip BCb.

The controller 101b toggles the data strobe signal DQS/DQSn every time it outputs 8-bit data (S710). The controller 101b generates the data strobe signal DQS/DQSn by delaying the read enable signal RE/REn supplied from the host HA. In other words, the bridge chip BCb toggles the data strobe signal DQS/DQSn to be supplied to the host HA at a frequency twice higher than that of the data strobe signal DQS/DQSn to be supplied from the memory chip CP1 concerned to the bridge chip BCb.

The memory chip CP1 completes the transfer of the data concerned to the bridge chip BCb (S711). The bridge chip BCb completes the data transfer to the host HA substantially at the same timing as in S711 (S712).

The operation timing of S712 is adjusted to be slightly later than the operation timing of S711. The operation timing of S712 is adjusted by, for example, notifying the host HA about the progress information 122 (S804 in FIG. 12) with a slight delay from the timing when the amount of data buffered in the buffer memory 102 has reached the threshold (Yes in S803 in FIG. 12). The adjusting method of the timing in S712 is not limited thereto.

According to the third embodiment, thus, the bridge chip BCb buffers the data from the memory chip CP in the buffer memory 102, and notifies the host HA of the progress information 122 in response to the event that the amount of the data buffered in the buffer memory 102 has reached the threshold defined according to the size information 121.

Thus, it is made possible to decrease the waiting time of the host for acquiring the data from the bridge chip, as compared with that of the host to wait until the bridge chip receives all the pieces of data to be output, resulting in avoiding the decrease in the data transfer rate.

The bridge chip BCb starts supplying the data from the buffer memory 102 to the host HA after notifying the host HA of the progress information 122.

In addition, where the data transfer rate between the host HA and the bridge chip BCb is N times higher than that between the bridge chip BCb and the memory chip CP, the threshold is calculated by multiplying the data size indicated by the size information 121 by (1−1/N).

Thereby, the memory chip CP completes data transfer to the bridge chip BCb at substantially the same timing at which the bridge chip BCb completes data transfer to the host HA. Because of this, the bridge chip BCb can advance data transfer start timing with respect to the host HA as much as possible, preventing occurrence of the event that no data remains in the buffer memory 102 in the middle of data transfer from the bridge chip BCb to the host HA. That is, it is possible to prevent unnecessary elongation of the data transfer time from the bridge chip BCb to the host HA. The length of time for which the channel CH0 is occupied with the data transfer from the bridge chip BCb to the host HA can be shortened, improving the usage efficiency of the channel CH0. That is, the host HA can effectively use an increased time to access another memory chip CP, for example. Thereby, the data transfer rate between the memory chip CP and the host HA can be improved.

Fourth Embodiment

The signal line groups of the ready/busy signals R/Bn output from the memory chips may be combined into one signal line. In such a case, during the busy state of one of the memory chips, the host may not be able to identify the memory chip in the busy state from among the memory chips according to the ready/busy signal R/Bn. The host individually provides Read Status commands to the memory chips, to be able to acquire status information from each of the memory chips and identify the memory chip in the busy state according to the status information. The busy state of the memory chip CP refers to a situation that the memory chip CP cannot execute a command upon receipt. The memory chip CP in a ready state refers to a situation that the memory chip CP stands by for receiving a command.

According to a toggle DDR standard, however, the memory chip outputs the status information a certain length of time, defined by the toggle DDR standard, after receiving the Read Status command. In addition, in the case of the memory chips commonly connected to one channel, the host is to serially acquire the status information from the respective memory chips. That is, it takes a lot of time for the host to identify the memory chip in the busy state.

In the fourth embodiment, the bridge chip receives the ready/busy signals R/Bn individually from the memory chips and generates ready/busy information representing the ready state or the busy state of each of the memory chips, in accordance with the ready/busy signals R/Bn. The ready/busy information is stored in the register of the bridge chip as one piece of the status information. The host can collectively check the ready state or the busy state of each memory chip by reading the ready/busy information from the register. This can shorten the time taken for the host to check the states of the individual memory chips.

A semiconductor device according to the fourth embodiment is referred to as a semiconductor device 1c. A bridge chip according to the fourth embodiment is referred to as a bridge chip BCc. The same or like elements as those of the first, second, or third embodiment are denoted by the same reference signs as therein, and they will be briefly described or their descriptions will be omitted.

The fourth embodiment can be applied together with the first embodiment or the first modification of the first embodiment, the second embodiment or the second modification of the second embodiment, or the third embodiment. Herein, the fourth embodiment is applied together with the first embodiment, the second embodiment, and the third embodiment, as an example.

Figure 13:
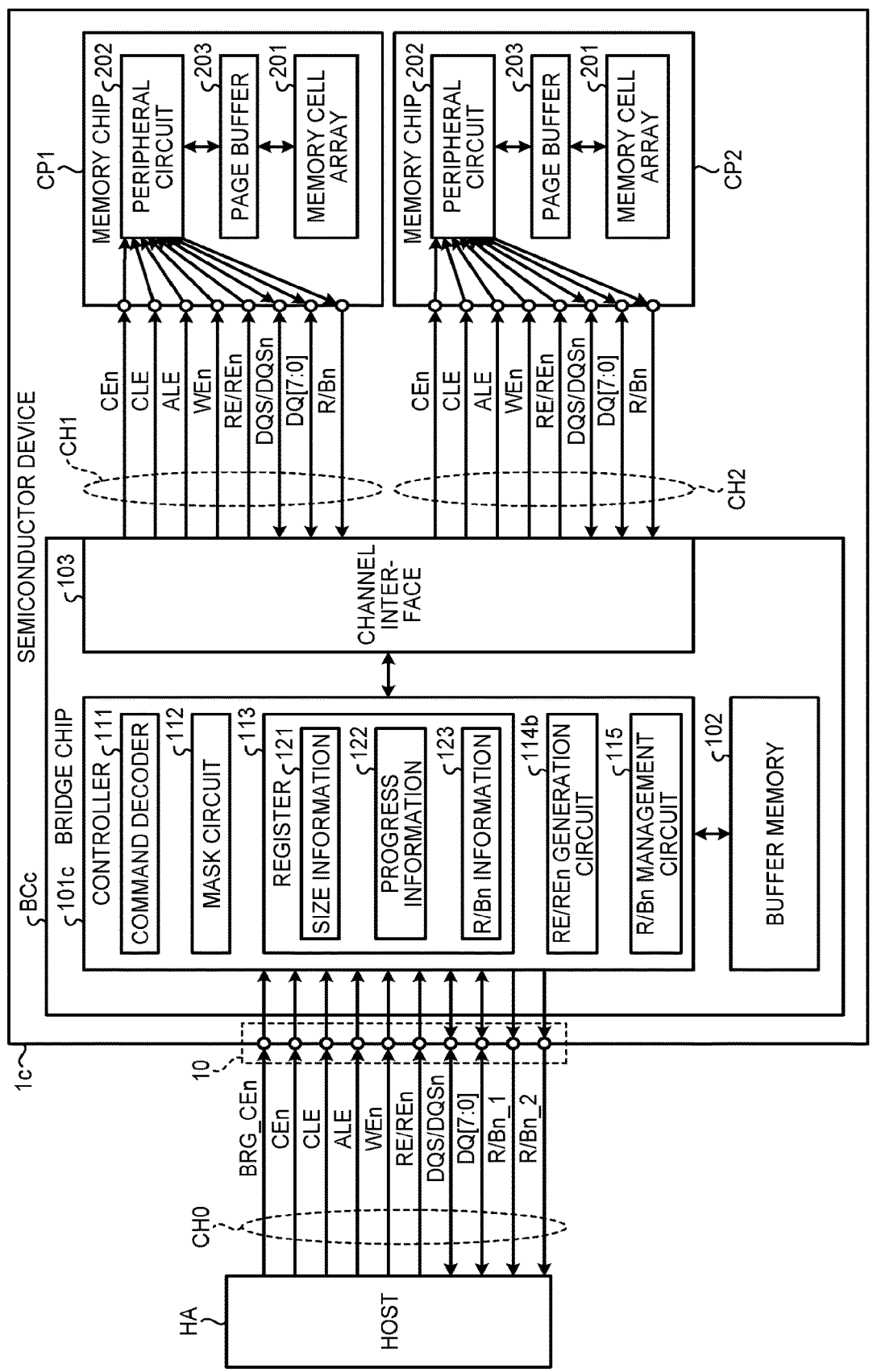
FIG. 13 is a schematic diagram illustrating an exemplary configuration of a semiconductor device according to a fourth embodiment.

FIG. 13 is a schematic diagram illustrating an exemplary configuration of the semiconductor device 1c according to the fourth embodiment. The semiconductor device 1c includes the bridge chip BCc and memory chips CP1-1 to CP1-4 and CP2-1 to CP2-4. FIG. 13 illustrates one memory chip CP1 and one memory chip CP2 as representatives of the memory chips CP1-1 to CP1-4 and the memory chips CP2-1 to CP2-4, as with FIG. 2.

Each of the memory chips CP includes a memory cell array 201, a peripheral circuit 202, and a page buffer 203.

The bridge chip BCc includes a controller 101c, a buffer memory 102, and a channel interface 103. The controller 101c includes a command decoder 111, a mask circuit 112, a register 113, a RE/REn generation circuit 114b, and an R/Bn management circuit 115. The register 113 can store the size information 121, the progress information 122, and the R/Bn information 123. The R/Bn information 123 contains information representing the ready state or the busy state of each of the memory chips CP1-1 to CP1-4 and CP2-1 to CP2-4.

Figure 14:
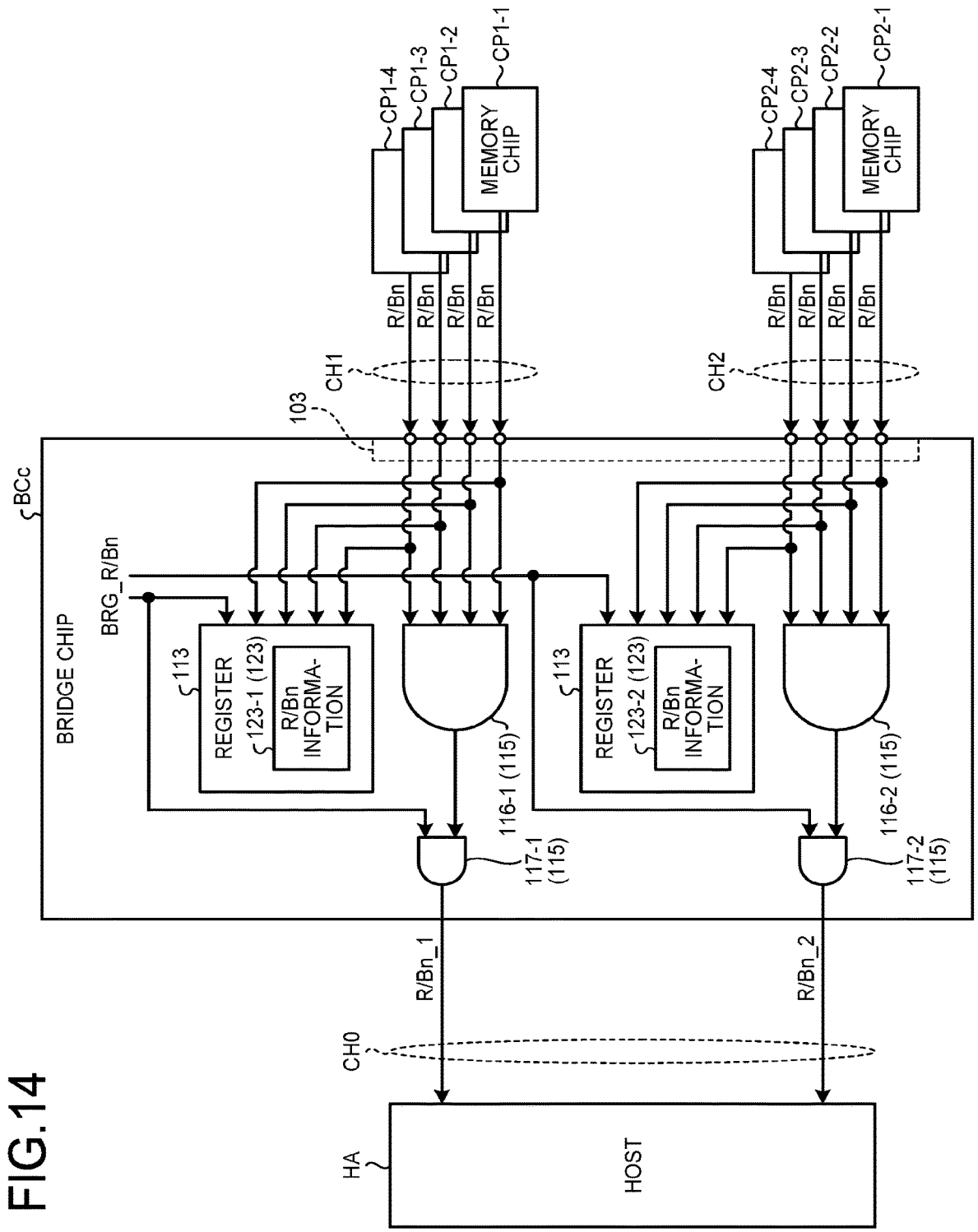
FIG. 14 is a schematic diagram illustrating an example of a detailed configuration of an R/Bn management circuit according to the fourth embodiment.

FIG. 14 is a schematic diagram illustrating an example of a detailed configuration of the R/Bn management circuit 115 according to the fourth embodiment. The R/Bn management circuit 115 includes a first AND circuit 116-1, a first AND circuit 116-2, a second AND circuit 117-1, and a second AND circuit 117-2. The first AND circuit 116-1 and the second AND circuit 117-1 correspond to the channel CH1. The first AND circuit 116-2 and the second AND circuit 117-2 correspond to the channel CH2.

The first AND circuit 116-1 has four input terminals. The first AND circuit 116-1 individually receives the ready/busy signals R/Bn from the four memory chips CP1-1 to CP1-4 connected to the channel CH1 through the four input terminals. That is, the first AND circuit 116-1 is connected to the four memory chips CP1-1 to CP1-4 via the four input terminals, respectively. The first AND circuit 116-1 receives the ready/busy signals R/Bn from the memory chips CP1-1 to CP1-4 and outputs a logical AND thereof.

The second AND circuit 117-1 has two input terminals. One of the two input terminals of the second AND circuit 117-1 receives an output signal from the first AND circuit 116-1. The other of the input terminals of the second AND circuit 117-1 receives a bridge ready/busy signal BRG R/Bn indicating the ready state or the busy state of the bridge chip BCc. The controller 101c generates the bridge ready/busy signal BRG R/Bn, for example. The second AND circuit 117-1 outputs a logical AND of an output signal from the first AND circuit 116-1 and the bridge ready/busy signal BRG R/Bn. The bridge ready/busy signal BRG R/Bn can be used in any control. For example, the bridge chip BCc can be used in the notifying operation (S705) as to the progress information in the third embodiment.

The second AND circuit 117-1 supplies the output signal to the host HA as the ready/busy signal R/Bn_1 for the channel CH1.

Thus, the host HA can check whether all of the bridge chip BCc and the four memory chips CP1-1 to CP1-4 are in the ready state or whether any of the bridge chip BCc and the four memory chips CP1-1 to CP1-4 is in the busy state, by referring to the ready/busy signal R/Bn_1.

Four signal lines for the ready/busy signals R/Bn connecting the four input terminals of the first AND circuit 116-1 and the four memory chips CP1-1 to CP1-4 each branch and are connected to the register 113. Statuses of the four signal lines for transferring the ready/busy signals R/Bn are stored in real time in part of the R/Bn information 123 (referred to as R/Bn information 123-1) in the register 113. The status of the bridge ready/busy signal BRG R/Bn is also stored in real time in the R/Bn information 123-1.

The first AND circuit 116-2 has four input terminals. The first AND circuit 116-2 individually receives the ready/busy signals R/Bn from the four memory chips CP2-1 to CP2-4 connected to the channel CH2 through the four input terminals. That is, the first AND circuit 116-2 is connected to the four memory chips CP2-1 to CP2-4 through the four input terminals, respectively. The first AND circuit 116-2 outputs a logical AND of the ready/busy signals R/Bn from the memory chips CP2-1 to CP2-4.

The second AND circuit 117-2 has two input terminals. One of the two input terminals of the second AND circuit 117-2 receives an output signal from the first AND circuit 116-2. The other of the input terminals of the second AND circuit 117-2 receives the bridge ready/busy signal BRG R/Bn. The second AND circuit 117-2 outputs a logical AND of the output signal from the first AND circuit 116-2 and the bridge ready/busy signal BRG R/Bn.

The second AND circuit 117-2 supplies the output signal to the host HA as the ready/busy signal R/Bn_2 for the channel CH2.

The bridge chip BCc may use, for example, an AND circuit to generate one ready/busy signal R/Bn from the ready/busy signal R/Bn_1 for the channel CH1 and the ready/busy signal R/Bn_2 for the channel CH2, and supply the ready/busy signal R/Bn to the host HA. Further, the bridge chip BCc may not include the second AND circuit 117-1 and the second AND circuit 117-2. Instead, the bridge chip BCc may allow the first AND circuit 116-1 to output an output signal to the host HA as the ready/busy signal R/Bn_1 for the channel CH1, the first AND circuit 116-2 to output an output signal to the host HA as the ready/busy signal R/Bn_2 for the channel CH2 and output the bridge ready/busy signal BRG R/Bn to the host HA separately from the ready/busy signal R/Bn_1 and the ready/busy signal R/Bn_2. Alternatively, the bridge chip BCc may use an AND circuit to generate one ready/busy signal R/Bn from the output signal from the first AND circuit 116-1 and the output signal from the first AND circuit 116-2, and independently output the ready/busy signal R/Bn and the bridge ready/busy signal BRG R/Bn to the host HA.

Four signal lines for the ready/busy signals R/Bn connecting the four input terminals of the first AND circuit 116-2 and the four memory chips CP2-1 to CP2-4 each branch and are connected to the register 113. The statuses of the four signal lines for transferring the ready/busy signals R/Bn are stored in real time in another part of the R/Bn information 123 (referred to as R/Bn information 123-2) in the register 113. The status of the bridge ready/busy signal BRG R/Bn is also stored in real time in the R/Bn information 123-2.

Thus, the host HA can check whether all of the bridge chip BCc and the four memory chips CP2-1 to CP2-4 are in the ready state or whether any of the bridge chip BCc and the four memory chips CP2-1 to CP2-4 is in the busy state, by referring to the ready/busy signals R/Bn_2.

In addition, the host HA can collectively check the ready state or the busy state of each of the bridge chip BCc and the eight memory chips CP1-1 to CP1-4 and CP2-1 to CP2-4 by reading the R/Bn information 123. The arrangement of the R/Bn information 123 is not limited to the above example. The R/Bn information 123-1 and the R/Bn information 123-2 may be stored together in the register 113. As a result, the host HA can collectively know the ready state or the busy state of each of the bridge chip BCc and the eight memory chips CP1-1 to CP1-4 and CP2-1 to CP2-4 by reading the R/Bn information 123.

Figure 15:
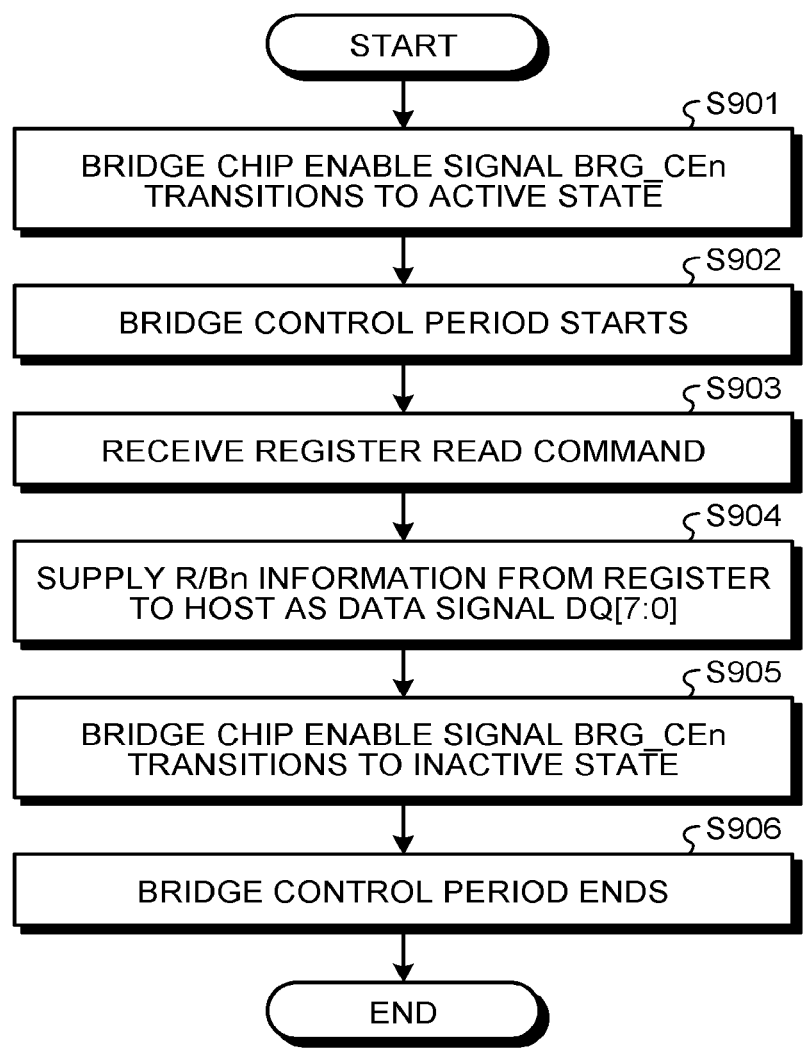
FIG. 15 is a flowchart illustrating an operation by the semiconductor device for supplying R/Bn information to the host according to the fourth embodiment.

FIG. 15 is a flowchart illustrating an operation of the semiconductor device 1c for supplying the R/Bn information 123 to the host HA in the fourth embodiment.

First, the host HA causes the bridge chip enable signal BRG_CEn to transition to an active state or L-level (S901), starting the bridge control period (S902). The host HA supplies a given register read command to the bridge chip BCc during the bridge control period, such as a Read Status command, a Get Feature command, or a specifically defined register read command.

After the bridge chip BCc receives the register read command (S903), the controller 101c reads the R/Bn information 123 from the register 113 and supplies the R/Bn information 123 to the host HA by the data signal DQ[7:0] (S904).

The register read command may be configured to be able to allow designation of either of the R/Bn information 123-1 and 123-2. In such a case, in S904 the bridge chip BCc can read the designated one of the R/Bn information 123-1 and 123-2 from the register 113 and supply that to the host HA.

After S904, the host HA causes the bridge chip enable signal BRG_CEn to transition to an inactive state or H-level (S905), ending the bridge control period of the bridge chip BCc (S906). Then, the semiconductor device 1c completes supplying the R/Bn information 123 to the host HA.

According to the fourth embodiment, thus, the bridge chip BCc is connected to the memory chips CP through the signal lines for transferring the ready/busy signals R/Bn, respectively. The bridge chip BCc is supplied with the statuses of the ready/busy signals R/Bn from the memory chips CP through the signal lines and individually store their statuses in the R/Bn information 123 in the register 113 for the memory chips CP. The bridge chip BCc then outputs the R/Bn information 123 to the host HA.

Thus, the host HA can collectively check the ready state or the busy state of the memory chips CP. It takes a less time for the host HA to know the state of each of the memory chips CP, as compared with the host's individually supplying the Read Status commands to the memory chips CP. Shortening the time taken for knowing the state of the memory chip CP enables the host HA to use an increased time for other purposes such as data transfer to the memory chip CP. It is thus possible to improve the data transfer rate between the host HA and the memory chips CP.

Further, according to the fourth embodiment, the R/Bn management circuit 115 executes a computation including the logical AND of the ready/busy signals R/Bn from the memory chips CP, and outputs the resultant output signal to the host HA as the ready/busy signal R/Bn_1 or the ready/busy signal R/Bn_2.

Traditionally, the signal line groups for the ready/busy signals R/Bn that the memory chips CP output may be combined into one signal line to be connected to the host, as described above. In the fourth embodiment, owing to the above features the host HA can receive the ready/busy signal R/Bn equivalent to the conventional ready/busy signal R/Bn.

According to the fourth embodiment, the R/Bn management circuit 115 generates the bridge ready/busy signal BRG R/Bn being the ready/busy signal for the bridge chip BCc itself. The R/Bn management circuit 115 calculates the logical AND of the ready/busy signals R/Bn from the memory chips CP and the bridge ready/busy signal BRG R/Bn.

The R/Bn management circuit 115 may not calculate the logical AND of the ready/busy signals R/Bn from the memory chips CP and the bridge ready/busy signal BRG R/Bn.

In addition, according to the fourth embodiment the R/Bn management circuit 115 stores the bridge ready/busy signal BRG R/Bn in the R/Bn information 123.

Thus, the host HA can check the ready state or the busy state of the bridge chip BCc and each of the memory chips CP at the same time.

The bridge chip BCc outputs the R/Bn information 123 to the host HA in response to the register read command such as the Read Status command, the Get Feature command, or the specifically defined register read command.

The bridge chip BCc can receive the read command for the R/Bn information 123 during the bridge control period.

That is, the bridge chip BCc refrains from transferring the read command for the R/Bn information 123 to the memory chip CP. This makes it possible to avoid the memory chip CP from malfunctioning due to the read command for the R/Bn information 123, thereby reducing occurrence of unnecessary waiting time. As a result, the data transfer rate between the host HA and the memory chips CP can be improved.

The bridge chip BCc may be configured to be able to receive the read command for the R/Bn information 123 during the non-bridge control period.

Fifth Embodiment

To perform a read operation to the memory chips, generally, the host is to transmit a pair of a Page Read command and a Data Output command. The pair of a Page Read command and a Data Output command is referred to as a read command pair. Each of the memory chips can output one-page data at maximum in response to the Data Output command. Hence, to read multiple-page data, the host is to transmit two or more read command pairs.

In the case of two or more memory chips holding data to be output, the bridge chip operates the memory chips holding the data concerned in parallel to be able to seamlessly receive the group of data concerned from the memory chips.

As long as the bridge chip can seamlessly receive the group of data and seamlessly transfer the data to the host, the data transfer rate between the host and the bridge chip can be improved. However, the host is required to transmit the read command pair at least on a page basis, as described above. During transmission of the read command pair, the channel between the host and the bridge chip is occupied with the transfer of the read command pair, so that the host is forced to stop acquiring the data from the bridge chip. That is, the data transfer rate between the host and the memory chips decreases due to the host's transmitting the multiple read command pairs.

In the fifth embodiment, a multi-read command is defined as a specific command. In response to receiving a multi-read command from the host, the bridge chip autonomously generates a plurality of read command pairs. The bridge chip can autonomously transmit each of the generated read command pairs to a destination memory chip. The bridge chip seamlessly receives a group of data concerned output from the memory chips by the read command pairs. Without transmitting the read command pair, the host can seamlessly receive the group of data, which the bridge chip has seamlessly received, from the bridge chip after transmitting the multi-read command.

The fifth embodiment will be described hereinafter. The fifth embodiment can be applied together with the first embodiment or the first modification of the first embodiment, the second embodiment or the second modification of the second embodiment, the third embodiment, or the fourth embodiment. Herein, the fifth embodiment is applied together with the first embodiment, the second embodiment, the third embodiment, and the fourth embodiment, as an example.

A semiconductor device according to the fifth embodiment is referred to as a semiconductor device 1d. A bridge chip according to the fifth embodiment is referred to as a bridge chip BCd. The same or like elements as those of the first, second, third, or fourth embodiment are denoted by the same reference signs as therein, and they will be briefly described or their descriptions will be omitted.

Figure 16:
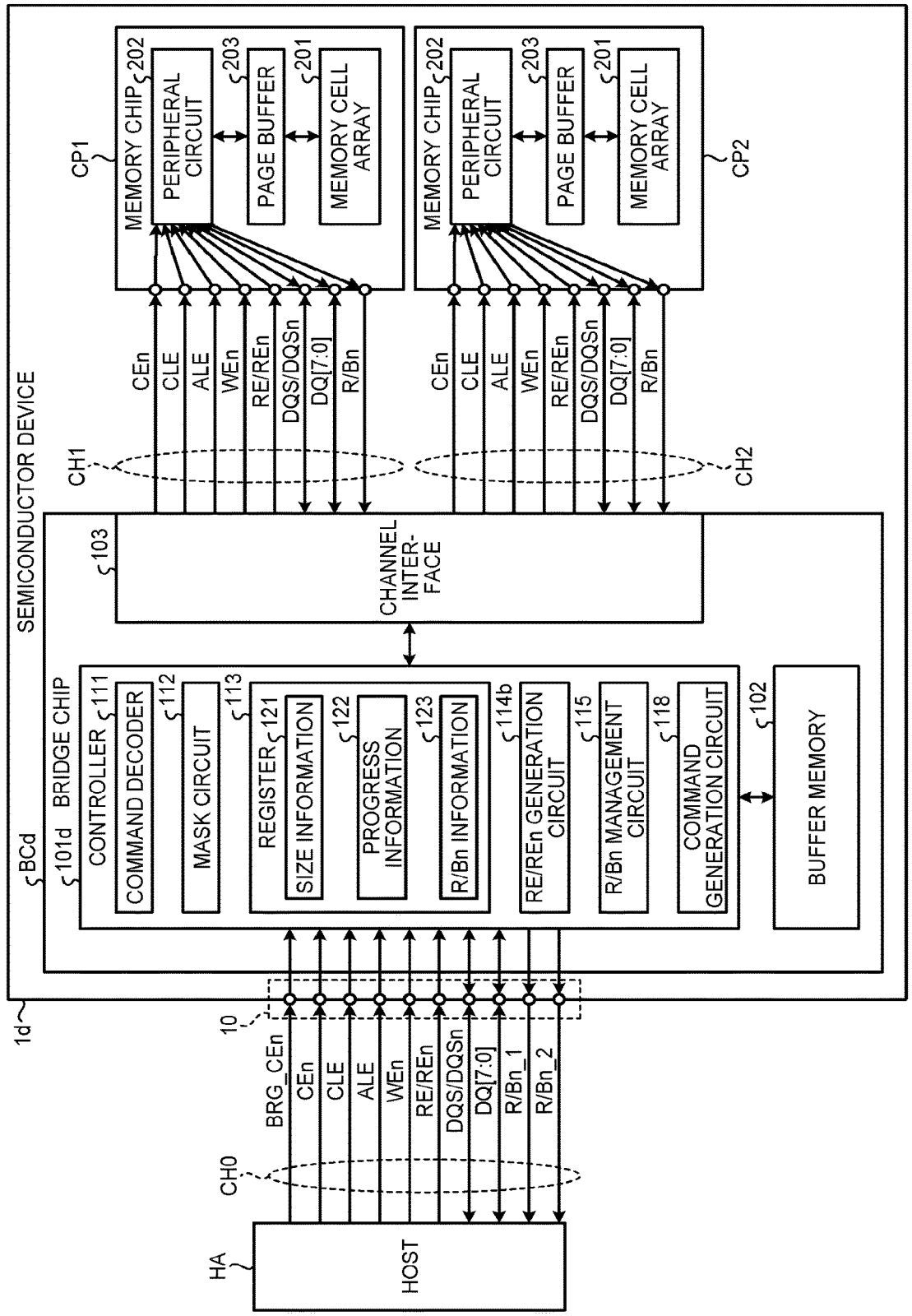
FIG. 16 is a schematic diagram illustrating an exemplary configuration of a semiconductor device according to a fifth embodiment.

FIG. 16 is a schematic diagram illustrating an exemplary configuration of the semiconductor device 1d according to the fifth embodiment. The semiconductor device 1d includes the bridge chip BCd and a plurality of memory chips CP1-1 to CP1-4 and CP2-1 to CP2-4. FIG. 16 illustrates one memory chip CP1 and one memory chip CP2 as representatives of the memory chips CP1-1 to CP1-4 and the memory chips CP2-1 to CP2-4, as with FIG. 2.

Each of the memory chips CP includes a memory cell array 201, a peripheral circuit 202, and a page buffer 203.

The bridge chip BCd includes a controller 101d, a buffer memory 102, and a channel interface 103. The controller 101d includes a command decoder 111, a mask circuit 112, a register 113, a RE/REn generation circuit 114b, a R/Bn management circuit 115, and a command generation circuit 118. The size information 121, the progress information 122, and the R/Bn information 123 can be stored in the register 113.

The buffer memory 102 has a capacity of two or more pages in the fifth embodiment. That is, the bridge chip BCd can buffer two-page data or more read from the memory chip CP. The data transfer rate between the host HA and the bridge chip BCd is twice higher than the data transfer rate between the bridge chip BCd and the memory chip CP.

The command decoder 111 receives and interprets a command from the host HA as the multi-read command, and the command generation circuit 118 generates two or more read command pairs in response to the multi-read command.

FIG. 17 is a schematic diagram illustrating an exemplary configuration of the multi-read command according to the fifth embodiment. As illustrated in FIG. 17, the multi-read command includes a command value representing the multi-read command, an initial address value, an interval set value, and a read count set value.

The command generation circuit 118 first generates a read command pair for reading data from a location indicated by the initial address value.

The interval set value indicates an interval between reading locations. To generate a next read command pair, the command generation circuit 118 calculates an address value for designating the location of data concerned in the next read command pair by incrementing an address value used for designating the location of data concerned in the previous read command pair by the interval set value.

A full address value, that is, an address value for uniquely identifying a location within the memory chips CP1-1 to CP1-4 and CP2-1 to CP2-4, includes a first bit string that designates one of the two channels CH1 and CH2, a second bit string that designates one of the four memory chips CP connected to one channel, a third bit string that designates one page in one memory chip CP, and a fourth bit string that designates a location in one page.

The interval set value can be designated for each of the first, second, and third bit strings of the full address value. The interval set value x of the first bit string, the interval set value y of the second bit string is, and the interval set value z of the third bit string are collectively expressed as (x, y, z).

At the interval set value being (0, 0, 1), among the memory chips CP1-1 to CP1-4 and CP2-1 to CP2-4 only the memory chip CP, designated by the combination of the first bit string and the second bit string of the initial address value, is set to a transmission destination of a read command pair. The transmission destination of the read command pair is referred to as a target memory chip CP. The command generation circuit 118 generates an initial read command pair designating, as a reading location, a page indicated by the third bit string of the initial address value of the target memory chip CP. Thereafter, the command generation circuit 118 sequentially generates read command pairs while advancing the reading location page by page.

At the interval set value being (0, 1, 1), among the memory chips CP1-1 to CP1-4 and CP2-1 to CP2-4 all the four memory chips CP connected to the channel designated by the first bit string of the initial address value are set to transmission destinations of the read command pairs. The command generation circuit 118 generates an initial read command pair designating, as a reading location, a page indicated by the third bit string of the initial address value of the memory chip CP, which is designated by the combination of the first bit string and the second bit string of the initial address value. Next, the command generation circuit 118 sequentially generates three read command pairs while incrementing the second bit string by one without changing the third bit string. As a result, the command generation circuit 118 generates the read command pairs designating, as a reading location, the pages indicated by the same third bit string for all the four memory chips CP being the transmission destinations of the read command pairs. The command generation circuit 118 then advances the reading location by one page by incrementing the third bit string by one. The command generation circuit 118 sequentially generates four read command pairs while incrementing the second bit string by one. The command generation circuit 118 thereafter repeats the same operations. Thereby, the bridge chip BCd can sequentially receive data from all the four memory chips CP connected to the channel designated by the first bit string of the initial address value.

At the interval set value being (1, 1, 1), all the memory chips CP1-1 to CP1-4 and CP2-1 to CP2-4 are set to transmission destinations of the read command pairs. The command generation circuit 118 generates an initial read command pair designating, as a reading location, a page indicated by the third bit string of the initial address value of the memory chip CP, which is designated by the combination of the first bit string and the second bit string of the initial address value. Next, the command generation circuit 118 sequentially generates three read command pairs while incrementing the second bit string by one without changing the third bit string. The command generation circuit 118 increments the first bit string by one, and then sequentially generates four read command pairs while incrementing the second bit string by one. As a result, the command generation circuit 118 generates the read command pairs designating, as a reading location, the pages indicated by the same third bit string for all the memory chips CP being the transmission destinations of the read command pairs. Next, the command generation circuit 118 advances the reading location by one page by incrementing the third bit string by one. The command generation circuit 118 sequentially generates eight read command pairs while incrementing each of the first bit string and the second bit string by one. The command generation circuit 118 thereafter repeatedly executes such operations. Thereby, the bridge chip BCd can sequentially receive data from all the eight memory chips C.

The read count set value represents an upper limit of the number of read command pairs to generate. The command generation circuit 118 counts the number of read command pairs upon generation after receiving the multi-read command. When the number of generated read command pairs reaches the number indicated by the read count set value, the command generation circuit 118 ends generating the read command pairs, and resets the count value.

The multi-read command may not explicitly contain the interval set value. For example, a plurality of command values representing a multi-read command may be prepared such that any of the interval set value (0, 0, 1), the interval set value (0, 1, 1), and the interval set value (1, 1, 1) can be individually designated by the command values.

In addition, the interval set value is not limited to one. For example, the interval set value for the third bit string may be set to two to skip a reading location by one page.

The interval set value may not be set. For example, the multi-read command may exclude the interval set value, and the bridge chip BCd may be configured to execute only a predetermined operation, for example, the operation at the interval set value being (1, 1, 1), in response to receiving the multi-read command.

It is assumed that the bridge chip BC receives data from each of the memory chips CP in units of pages in response to the multi-read command.

Figure 18:
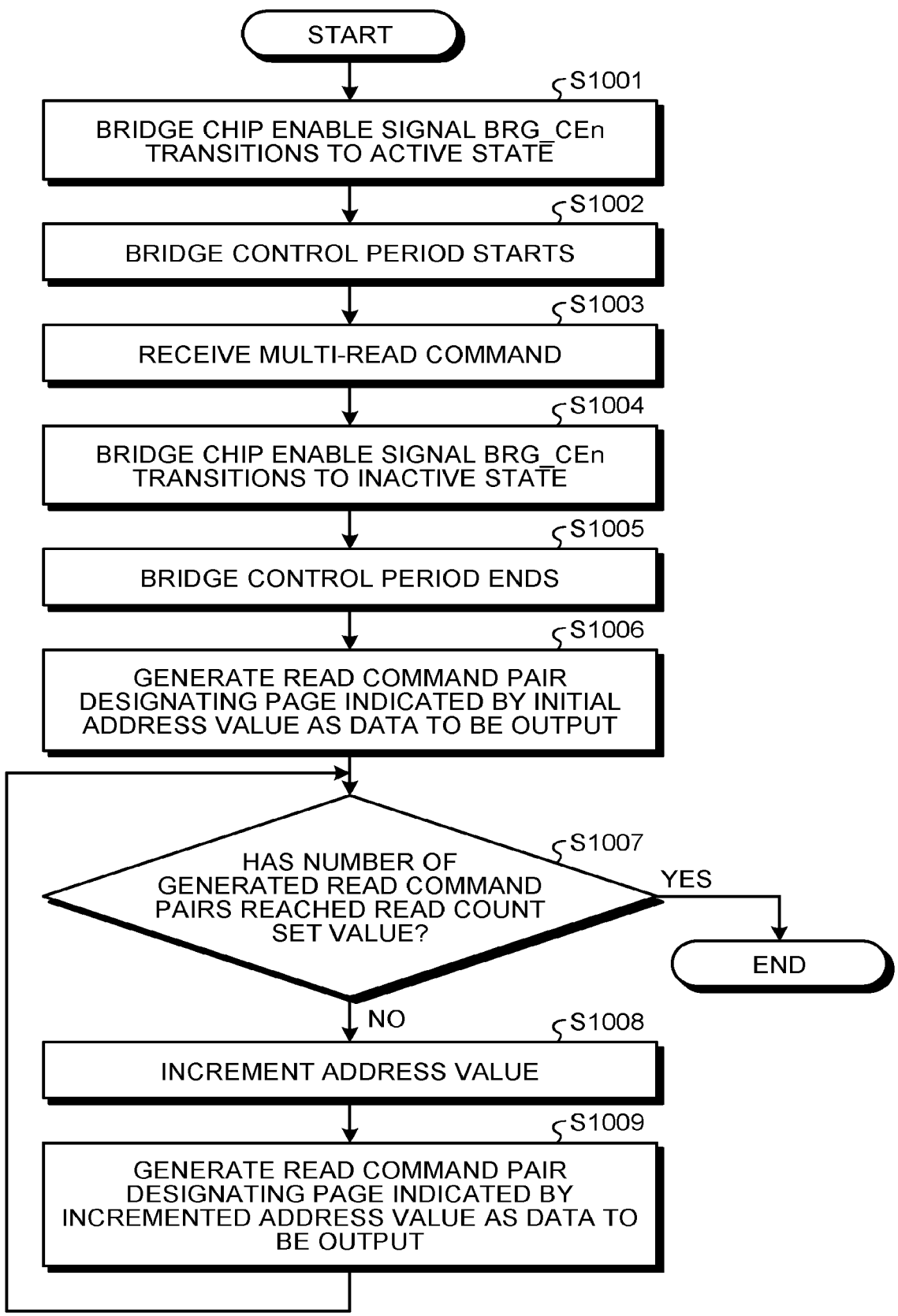
FIG. 18 is a flowchart illustrating an operation of generating a plurality of read command pairs according to the fifth embodiment.

FIG. 18 is a flowchart illustrating an operation of generating a plurality of read command pairs according to the fifth embodiment.

First, the host HA causes the bridge chip enable signal BRG_CEn to transition to an active state or L-level (S1001), starting the bridge control period (S1002). The host HA can supply a multi-read command to the bridge chip BCd during the bridge control period.

The bridge chip BCd receives the multi-read command (S1003). Then, the host HA causes the bridge chip enable signal BRG_CEn to transition to an inactive state or H-level (S1004). As a result, the bridge chip BCd ends the bridge control period (S1005).

Next, the bridge chip BCd starts operating in response to the multi-read command. First, the command generation circuit 118 generates a read command pair designating a page indicated by an initial address value as data to be output (S1006).

The command generation circuit 118 determines whether the number of generated read command pairs has reached a read count set value (S1007). After determining that the number of generated read command pairs has not reached the read count set value (No in S1007), the command generation circuit 118 increments the address value (S1008), and generates a read command pair designating a page indicated by the incremented address value as data to be output (S1009). The bridge chip BCd then returns to S1007.

After determining that the number of generated read command pairs has reached the read count set value (Yes in S1007), the bridge chip BCd ends generating the plurality of read command pairs.

The command generation circuit 118 supplies each of the generated read command pairs to the destination memory chip CP through the channel interface 103. The channel interface 103 checks whether the destination memory chip CP is in the ready state and the channel connected to the destination memory chip CP is available, from the ready/busy signal R/Bn or the R/Bn information 123 from each of the memory chips CP, and transmits the read command pair to the destination memory chip CP.

Figure 19:
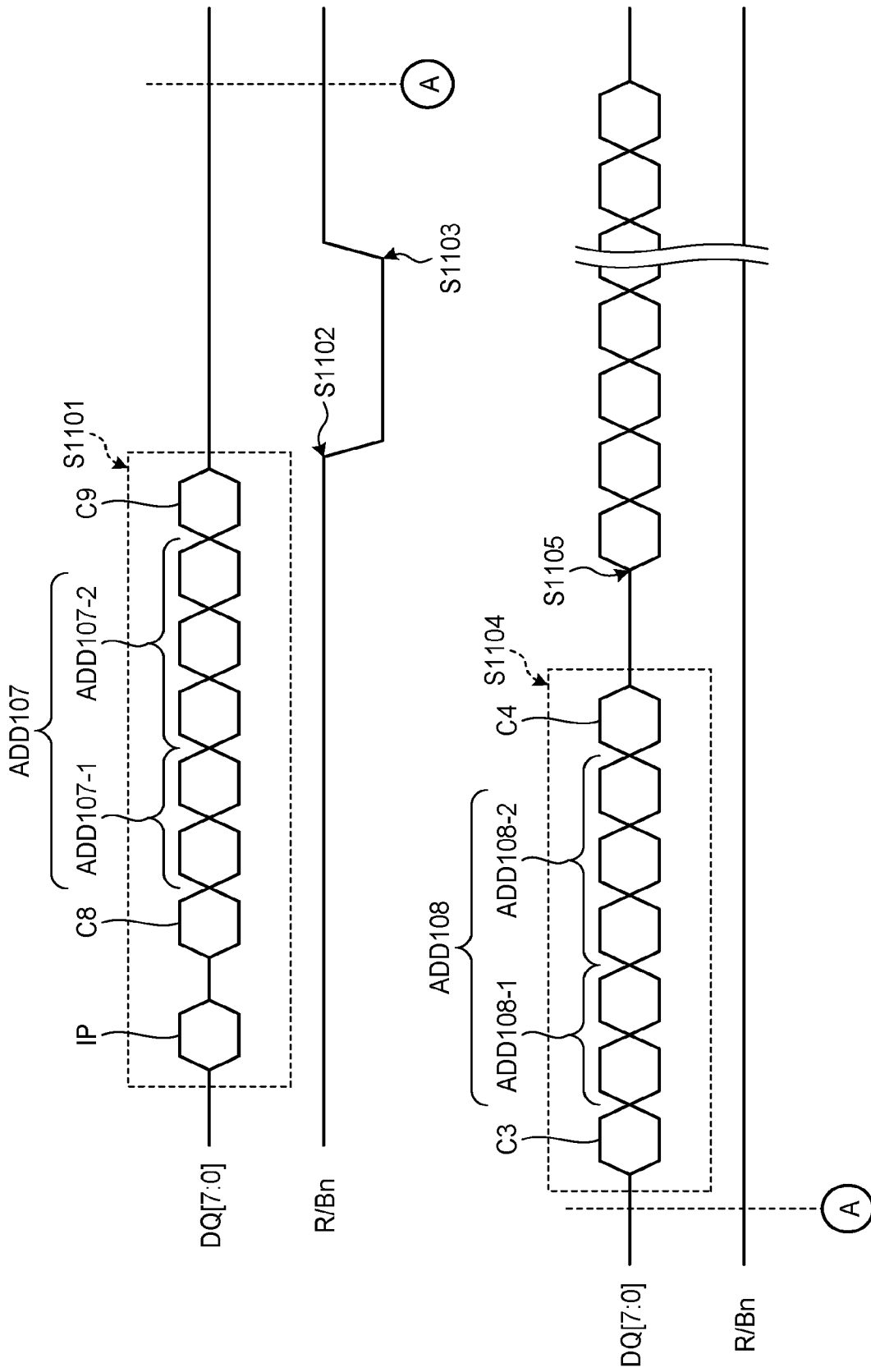
FIG. 19 is a schematic view illustrating an example of a command sequence of the read command pairs according to the fifth embodiment.

FIG. 19 is a schematic view illustrating an example of a command sequence of the read command pair according to the fifth embodiment.

It is assumed that each memory cell transistor can store 2-bit data or more in FIG. 19. That is, a group of memory cell transistors sharing a row can store two-page data or more.

First, the bridge chip BCd transmits a Page Read command of the read command pair to the memory chip CP (S1101). In S1101, the bridge chip BCd transmits a page identifier IP, a command value C8 representing the Page Read command, an address value ADD107 representing a reading location, and a command value C9 paired with the command value C8.

The address value ADD107 includes a column address value ADD107-1 indicating the location of a column and a row address value ADD107-2 indicating the location of a row. The page identifier IP refers to information for designating one page of multiple-page data stored in the group of memory cell transistors sharing the row indicated by the row address value ADD107-2. One of the pages is identified by a combination of the page identifier IP and the row address value ADD107-2.

The column address value ADD107-1 indicates a location in a page. That is, the column address value ADD107-1 corresponds to the fourth bit string as above.

In the memory chip CP as a destination of the Page Read command, the peripheral circuit 202 executes sensing in response to the Page Read command. That is, the peripheral circuit 202 reads a designated page from the memory cell array 201 to the page buffer 203. After completing the sensing, the memory chip CP can output data in response to the Data Output command.

After start of the sensing, the peripheral circuit 202 causes the ready/busy signal R/Bn to transition to a busy state (S1102). After completion of the sensing, the peripheral circuit 202 causes the ready/busy signal R/Bn to transition from the busy state to the ready state (S1103). That is, whether the memory chip CP has completed the sensing can be determined from the ready/busy signal R/Bn.

After completion of the sensing, the Data Output command is transmitted to the memory chip CP (S1104). The Data Output command transmitted in S1104 is configured the same as the Data Output command in the second embodiment. Specifically, the Data Output command includes the command values C3 and C4 representing the Data Output command and an address value ADD108.

The address value ADD108 includes a column address value ADD108-1 indicating a location of a column and a row address value ADD108-2 indicating a location of a row. The address value 108 included in the Data Output command represents only a head position of data to be output among pieces of data stored in the page buffer 203. Thus, the address value 108 may exclude the row address value 108-2. However, typically, the row address value ADD108-2 is set to the same value as the row address value 107-2 included in the Page Read command.

The column address value 107-1 included in the Page Read command may be different from the column address value ADD108-1 included in the Data Output command.

In the fifth embodiment data the bridge chip BCd receives data from each of the memory chips CP in units of pages in response to the multi-read command. In the case of the read command pair in response to the multi-read command, thus, the column address value ADD107-1 and the column address value ADD108-1 both represent the top of a page.

Receiving the Data Output command, the memory chip CP starts outputting data (S1105). This operation is equivalent to the operation described in the second embodiment.

The channel interface 103 adjusts timing for transmitting a plurality of read command pairs to the memory chips CP such that the memory chips CP operate in an interleaved manner.

Figure 20:
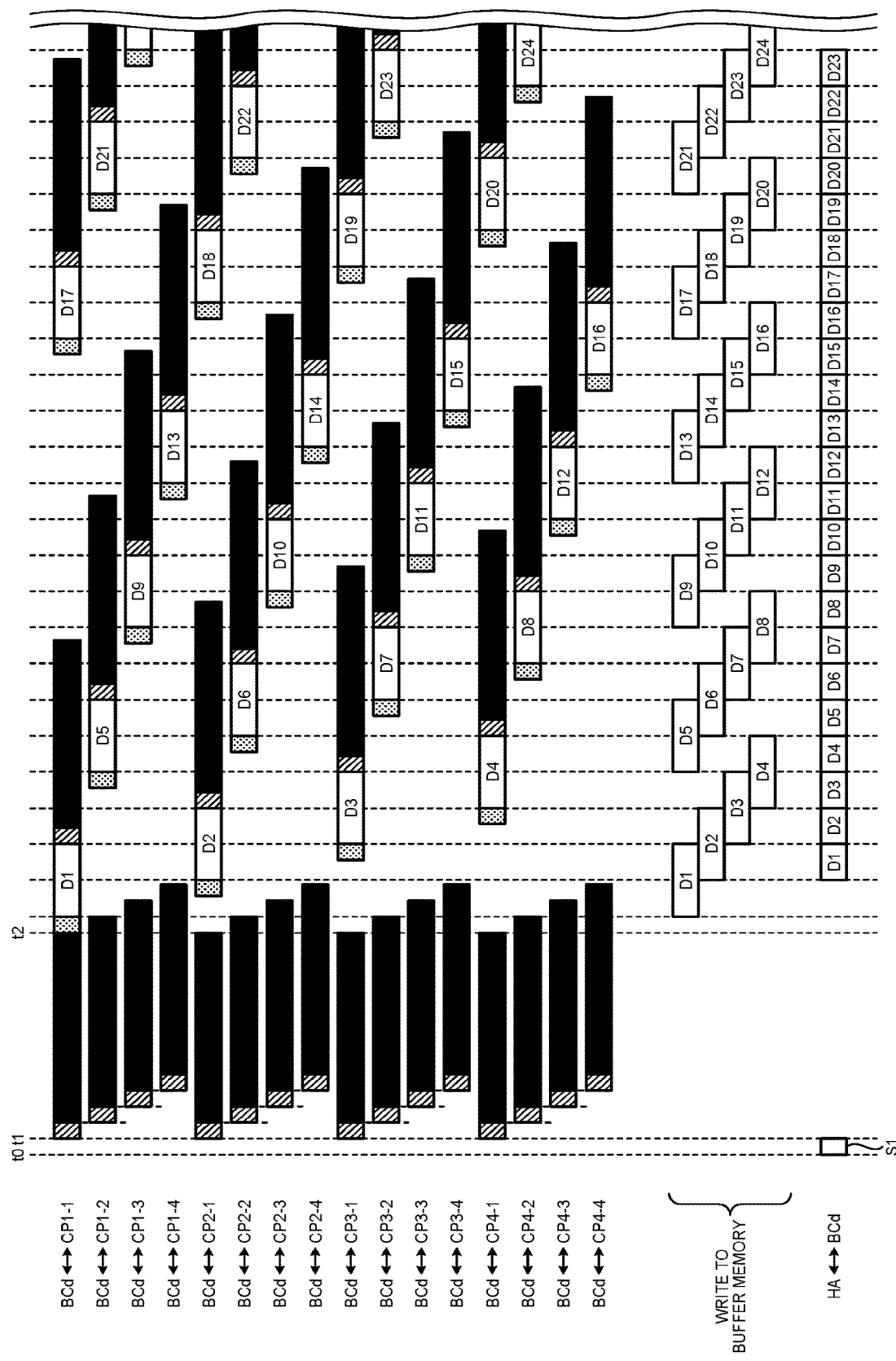
FIG. 20 is a timing chart illustrating an example of a transmission timing of the read command pairs according to the fifth embodiment.

FIG. 20 is a timing chart illustrating an example of the transmission timing of the read command pair according to the fifth embodiment. In the example illustrated in FIG. 20, the semiconductor device 1 includes sixteen memory chips CP1-1 to CP1-4, CP2-1 to CP2-4, CP3-1 to CP3-4, and CP4-1 to CP4-4. As an example, the memory chips CP1-1 to CP1-4 are connected to the bridge chip BCd via the channel CH1, the memory chips CP2-1 to CP2-4 are connected to the bridge chip BCd via the channel CH2, the memory chips CP3-1 to CP3-4 are connected to the bridge chip BCd via a channel CH3, and the memory chips CP4-1 to CP4-4 are connected to the bridge chip BCd via a channel CH4. The interval set value is set to (1, 1, 1), by way of example.

In FIG. 20, a rectangle hatched with diagonal lines represents a Page Read command transmission period. A black rectangle represents a sensing period. A rectangle hatched with dots represents a Data Output command transmission period. A white rectangle with data name DX (X is an integer) represents a transfer period of data DX to be output.

In response to receipt of the multi-read command from the host HA (S1, time t0), the command generation circuit 118 of the bridge chip BCd generates a plurality of read command pairs. The channel interface 103 then starts supplying the generated read command pairs (time t1).

Specifically, the channel interface 103 first transmits Page Read commands in parallel to the four memory chips CP1-1, CP2-1, CP3-1, and CP4-1 connected to the different channels. Next, the channel interface 103 transmits Page Read commands in parallel to the four memory chips CP1-2, CP2-2, CP3-2, and CP4-2. The channel interface 103 then transmits Page Read commands in parallel to the four memory chips CP1-3, CP2-3, CP3-3, and CP4-3. Next, the channel interface 103 transmits Page Read commands in parallel to the four memory chips CP1-4, CP2-4, CP3-4, and CP4-4. As a result, the Page Read commands are individually supplied to all the sixteen memory chips CP1-1 to CP1-4, CP2-1 to CP2-4, CP3-1 to CP3-4, and CP4-1 to CP4-4.

Each of the sixteen memory chips CP1-1 to CP1-4, CP2-1 to CP2-4, CP3-1 to CP3-4, and CP4-1 to CP4-4 executes sensing in response to the Page Read command. The four memory chips CP1-1, CP2-1, CP3-1, and CP4-1 complete the sensing (time t2). The channel interface 103 supplies Data Output commands to the four memory chips CP1-1, CP2-1, CP3-1, and CP4-1.

The channel interface 103 supplies the Data Output commands to the four memory chips CP1-1, CP2-1, CP3-1, and CP4-1 in sequence with time intervals so as to start receiving a page from the succeeding memory chip CP at the timing when having received a half of a page from the preceding memory chip CP.

Specifically, after completion of receipt of a half of one-page data D1 from the memory chip CP1-1, the channel interface 103 supplies the Data Output command to the memory chip CP2-1 so as to start receiving one-page page data D2 from the memory chip CP2-1. After completion of receipt of a half of one-page data D2 from the memory chip CP2-1, the channel interface 103 supplies the Data Output command to the memory chip CP3-1 so as to start receiving one-page page data D3 from the memory chip CP3-1. After completion of receipt of a half of one-page data D3 from the memory chip CP3-1, the channel interface 103 supplies the Data Output command to the memory chip CP4-1 so as to start receiving one-page page data D4 from the memory chip CP4-1.

After completion of receiving the data D1, the channel interface 103 transmits a Page Read command for data D17 to the memory chip CP1-1. After completion of receiving the data D2, the channel CH2 becomes free, so that the channel interface 103 transmits a Page Read command for data D18 to the memory chip CP2-1. After completion of receiving the data D3, the channel CH3 becomes free, so that the channel interface 103 transmits a Page Read command for data D19 to the memory chip CP3-1. After completion of receiving the data D4, the channel CH4 becomes free, so that the channel interface 103 transmits a Page Read command for data D20 to the memory chip CP4-1.

Each of the four memory chips CP1-1, CP2-1, CP3-1, and CP4-1 starts sensing in response to the Page Read command.

The channels become available after the corresponding memory chips CP1-1, CP2-1, CP3-1, and CP4-1 in connection are supplied with the Page Read commands. Thus, the channel interface 103 supplies Data Output commands to the next four memory chips CP1-2, CP2-2, CP3-2, and CP4-2.

The channel interface 103 also supplies the Data Output commands to the four memory chips CP1-2, CP2-2, CP3-2, and CP4-2 in sequence with time intervals so as to start receiving a page from the succeeding memory chip CP at the timing when having received a half of a page from the preceding memory chip CP.

After completion of receiving data D5 from the memory chip CP1-2, the channel interface 103 transmits a Page Read command for data D21 to the memory chip CP1-2. After completion of receiving data D6 from the memory chip CP2-2, the channel CH2 becomes free, so that the channel interface 103 transmits a Page Read command for data D22 to the memory chip CP2-2. After completion of receiving data D7 from the memory chip CP3-2, the channel CH3 becomes free, so that the channel interface 103 transmits a Page Read command for data D23 to the memory chip CP3-2. After completion of receiving data D8 from the memory chip CP4-2, the channel CH4 becomes free, so that the channel interface 103 transmits a Page Read command for data D24 to the memory chip CP4-2.

Each of the four memory chips CP1-2, CP2-2, CP3-2, and CP4-2 executes the sensing in accordance with the Page Read command.

The channel interface 103 supplies Data Output commands to the next four memory chips CP1-3, CP2-3, CP3-3, and CP4-3.

In this manner, the channel interface 103 executes access, i.e., command transmission and data acquisition, to the succeeding memory chip CP via the four channels in parallel such that the channel interface 103 accesses the succeeding memory chip CP while the preceding memory chip CP is executing sensing in each channel. Thereby, the bridge chip BCd can seamlessly receive data from the multiple memory chips CP.

As described in the third embodiment, the controller 101d of the bridge chip BCd notifies the host HA of the progress information 122 at the timing when it receives a half of data DX (not illustrated in FIG. 20). The host HA starts acquiring the data DX according to the progress information 122. The data transfer rate between the host HA and the bridge chip BCd is twice higher than the data transfer rate between the bridge chip BCd and the memory chip CP. That is, the host HA can receive data DX within a time as a half of the time taken for the bridge chip BC to receive data DX from the memory chip CP.

In addition, the buffer memory 102 has a capacity of two or more pages. Thus, the bridge chip BCd can receive succeeding data DX while preceding data DX is being stored in the buffer memory 102. In the example illustrated in FIG. 20, the channel interface 103 controls the supply timing of the Data Output command so as to start receiving a page from the succeeding memory chip CP at the timing when having received a half of a page from the preceding memory chip CP. Further, the host HA is not required to transmit the Page Read command or the Data Output command for every piece of data DX. After completion of the transmission of the multi-read command, the channel CH0 is no longer occupied with the command transmission, therefore, the host HA can start receiving the succeeding data DX immediately after receiving the preceding data DX. That is, the host HA can seamlessly receive the pieces of data DX that the buffer memory 102 has seamlessly received.

According to the fifth embodiment, thus, the bridge chip BCd generates the read command pairs in accordance with the multi-read command. The bridge chip BCd sequentially transmits the generated read command pairs to the destination memory chips CP. The bridge chip BCd sequentially buffers the data sequentially output from the memory chips CP in the buffer memory 102. The bridge chip BCd then outputs the data from the buffer memory 102 to the host HA.

The host HA can receive the data from the bridge chip BCd without using the channel CH0 to transmit the read command pairs. This can improve the data transfer rate between the host HA and the memory chips CP.

The bridge chip BCd sequentially acquires address values indicating reading locations for the read command pairs by increments.

Sixth Embodiment

The fifth embodiment has described the example that the bridge chip BCd acquires the reading locations by incrementing the address values, and autonomously issues the read command pairs for receiving data from the reading locations.

In a sixth embodiment, however, the bridge chip acquires a reading location from a list of address values provided in advance from the host.

The following will describe the sixth embodiment. The sixth embodiment can be applied together with the first embodiment or the first modification of the first embodiment, the second embodiment or the second modification of the second embodiment, the third embodiment, or the fourth embodiment. Herein, the sixth embodiment is applied together with the first embodiment, the second embodiment, the third embodiment, or the fourth embodiment, as an example.

A semiconductor device according to the sixth embodiment is referred to as a semiconductor device 1e. A bridge chip according to the sixth embodiment is referred to as a bridge chip BCe. The same or like elements as those of any of the first to fifth embodiments are denoted by the same reference signs as therein, and they will be briefly described or their description will be omitted.

Figure 21:
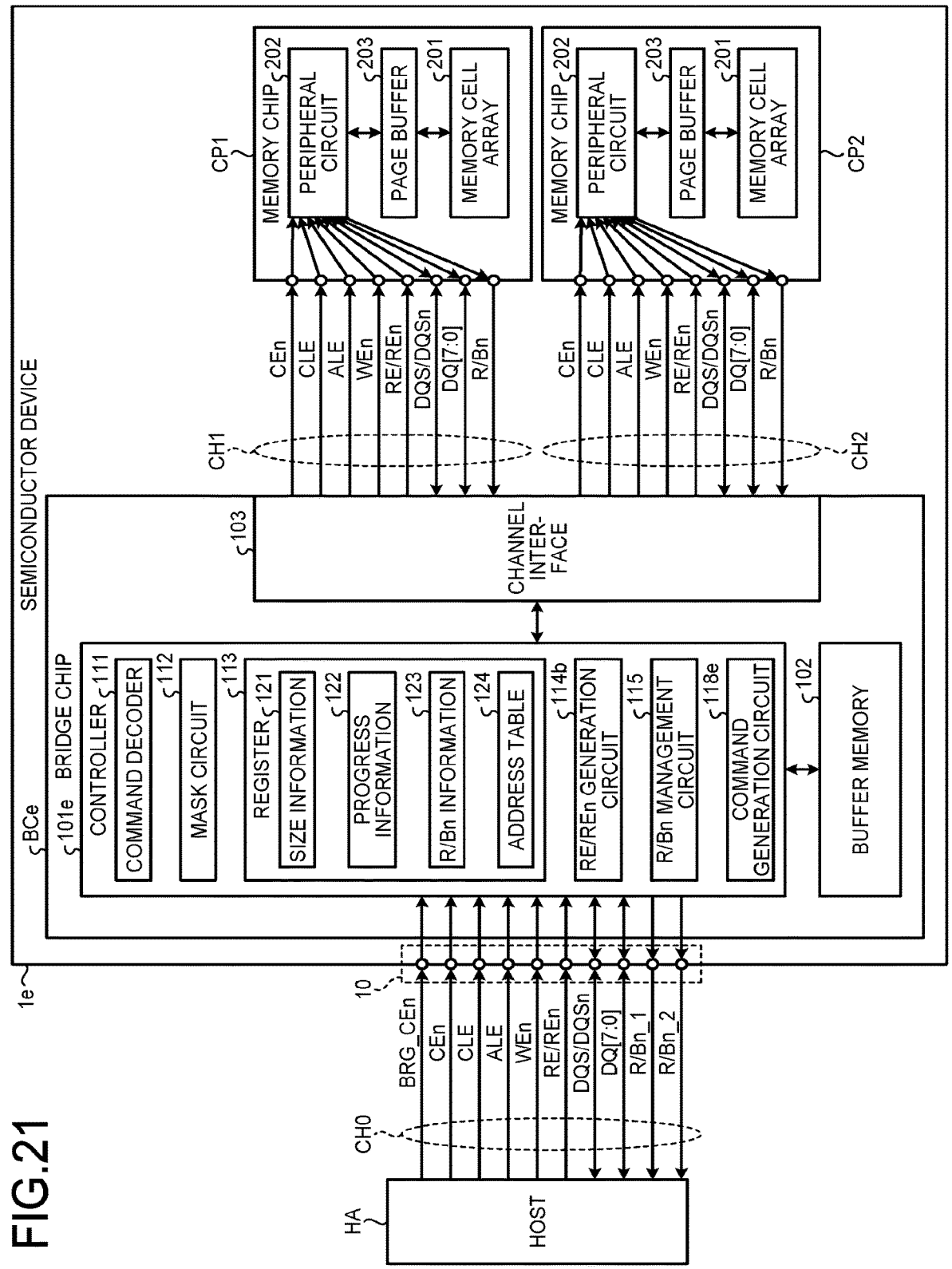
FIG. 21 is a schematic diagram illustrating an exemplary configuration of a semiconductor device according to a sixth embodiment.

FIG. 21 is a schematic diagram illustrating an exemplary configuration of the semiconductor device 1e according to the sixth embodiment. The semiconductor device 1e includes a bridge chip BCe and memory chips CP1-1 to CP1-4 and CP2-1 to CP2-4. FIG. 21 illustrates one memory chip CP1 and one memory chip CP2 as representatives of the memory chips CP1-1 to CP1-4 and the memory chips CP2-1 to CP2-4, as with FIG. 2.

Each of the memory chips CP includes a memory cell array 201, a peripheral circuit 202, and a page buffer 203.

The bridge chip BCe includes a controller 101e, a buffer memory 102, and a channel interface 103. The controller 101e includes a command decoder 111, a mask circuit 112, a register 113, a RE/REn generation circuit 114b, a R/Bn management circuit 115, and a command generation circuit 118e. The size information 121, the progress information 122, the R/Bn information 123, and the address table 124 can be stored in the register 113.

The command decoder 111 receives and interprets a command from the host HA as a multi-read command, and the command generation circuit 118e generates two or more read command pairs with reference to the address table 124.

Figure 22:
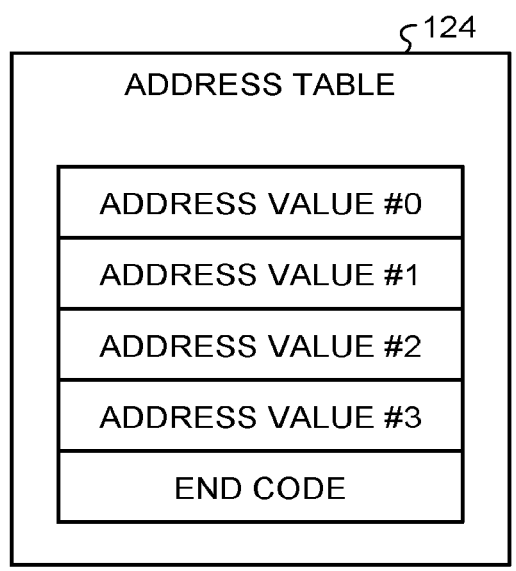
FIG. 22 is a view illustrating an example of a data structure of an address table according to the sixth embodiment.

FIG. 22 is a view illustrating an example of a data structure of the address table 124 according to the sixth embodiment. As illustrated in FIG. 22, the address table 124 is a list storing two or more address values. The address values stored in the address table 124 are full address values each including a first bit string that designates a channel, a second bit string that designates the memory chip CP, a third bit string that designates a page, and a fourth bit string that designates a location in a page. Each address value stored in the address table 124 indicates a reading location.

The command generation circuit 118e generates one read command pair for each address value stored in the address table 124. The command generation circuit 118e acquires address values in order starting from the top of the address table 124, and generates a read command pair designating the acquired address value as the reading location. The order of acquiring the address values from the address table 124 is not limited thereto.

In addition, the address table 124 may be individually prepared for the channels. Alternatively, the address table 124 may be prepared individually for the memory chips.

FIG. 23 is a timing chart illustrating a method of writing the address table 124 according to the sixth embodiment.

First, the host HA causes the bridge chip enable signal BRG_CEn to transition to an active state or L-level in order to transmit the address table 124 to the bridge chip BCe (S1201). This starts the bridge control period.

Next, the host HA transmits an address table setting command in order to write the address table 124 to the register 113 of the bridge chip BCe (S1202). In S1202 the host HA transmits a command value C10 representing the address table setting command and an address value ADD109 indicating a writing location of the address table 124 in the register 113 in this order.

The host HA transmits the address table setting command during the bridge control period in S1202, therefore, the controller 101e of the bridge chip BCe interprets the received command as addressed to itself. The command decoder 111 interprets the received command as the address table setting command.

Next, the host HA can transmit data D110 (S1203). The content of the address table 124 is denoted by D110. In S1203 the host HA supplies, as data signals [7:0], the content of the address table 124, that is, all address values and end codes therein, to the bridge chip BCe in a burst mode. The supplying method of the address table 124 is not limited to the supply in the burst mode. The host HA may divide the address table 124 into a plurality of parts to supply each of the parts together with the address table setting command.

The controller 101e receives and stores the address table 124 at a location indicated by the address value ADD109 in the register 113.

After completing the transmission of the data D110, the host HA causes the bridge chip enable signal BRG_CEn to transition to an inactive state or H-level (S1204). This ends the bridge control period. The operation of writing the address table 124 is now completed.

FIG. 24 is a flowchart illustrating an operation of generating a plurality of read command pairs according to the sixth embodiment.

First, the host HA causes the bridge chip enable signal BRG_CEn to transition to the active state or L-level (S1301). This starts the bridge control period (S1302).

Next, the bridge chip BCe receives a multi-read command from the host HA (S1303).

In the sixth embodiment, the multi-read command includes at least a command value representing the multi-read command. The multi-read command may not include an initial address value or an interval set value. The multi-read command may include an address value indicating a location where the address table 124 is stored. In addition, the address table 124 may include a read count set value. Herein, the multi-read command includes the read count set value.

Subsequent to S1303, the host HA causes the bridge chip enable signal BRG_CEn to transition to the inactive state or H-level (S1304). This ends the bridge control period (S1305).

At the time when the bridge chip BCe receives the multi-read command, the bridge chip enable signal BRG_CEn is maintained in the active state or L-level. Thus, the controller 101e interprets the received command as addressed to itself. The command decoder 111 interprets the received command as the multi-read command. The command generation circuit 118e then starts operating in accordance with the multi-read command.

First, the command generation circuit 118e acquires one record from the address table 124 (S1306). Initially, the command generation circuit 118e acquires one record from the top of the address table 124.

Next, the command generation circuit 118e determines whether the acquired record is an end code (S1307). After determining that the acquired record is not an end code (No in S1307) but an address value, the command generation circuit 118e generates a read command pair designating the acquired address value as a reading location (S1308).

The command generation circuit 118e determines whether the number of generated read command pairs has reached a read count set value (S1309). After determining that the number of generated read command pairs has not reached the read count set value (No in S1309), the command generation circuit 118e returns to S1306, and acquire a subsequent record.

After determining the acquired record as an end code (Yes in S1307) or determining that the number of generated read command pairs has reached the read count set value (Yes in S1309), the command generation circuit 118e ends generating the read command pairs.

Referring back to FIG. 21, the channel interface 103 individually supplies the read command pairs generated by the command generation circuit 118e to the destination memory chips CP. The channel interface 103 determines, from the ready/busy signal R/Bn or the R/Bn information 123 from each of the memory chips CP, that the destination memory chip CP is in a ready state and the channel connected to the destination memory chip CP is available, and then transmits the read command pair to the destination memory chip CP.

As in the fifth embodiment illustrating the address table 124, the channel interface 103 accesses the succeeding memory chip CP, i.e., transmits a command and receives data, while the preceding memory chip CP is executing sensing in each channel. In addition, the channel interface 103 can access the memory chips CP, i.e., transmits a command and receives data, through the channels in parallel such that while the preceding memory chip CP is executing sensing, the channel interface 103 accesses the succeeding memory chip CP. Thereby, the bridge chip BCe can seamlessly receive data from the memory chips CP.

Further, the channel interface 103 can control the supply timing of the Data Output command so as to start receiving a page from the succeeding memory chip CP at the timing when having received a half of a page from the preceding memory chip CP, as in the fifth embodiment.

The controller 101e of the bridge chip BCe notifies the host HA of the progress information 122 at the timing when it receives the half-page data. The host HA starts acquiring the data according to the progress information 122. The data transfer rate between the host HA and the bridge chip BCe is twice higher than the data transfer rate between the bridge chip BCe and the memory chip CP. Because of this, the host HA can receive data DX within a time as a half of the time taken for the bridge chip BC to receive data DX from the memory chip CP.

According to the sixth embodiment, thus, the operation illustrated in FIG. 20 is executable depending on the structure of the address table 124. Thus, the host HA can seamlessly receive the pieces of data DX that the buffer memory 102 has seamlessly received.

According to the sixth embodiment, as described above, the bridge chip BCe receives, from the host HA, the address table 124 listing the address values indicating the locations of read target concerned and stores the received address table 124 in the register 113. The bridge chip BCe then generates the read command pairs with reference to the address table 124.

The host HA can receive the data from the bridge chip BCd without using the channel CH0 to transmit the read command pairs. This can improve the data transfer rate between the host HA and the memory chips CP.

While certain embodiments have been described, these embodiments have been presented by way of example only, and are not intended to limit the scope of the inventions. Indeed, the novel methods and systems described herein may be embodied in different other forms; furthermore, various omissions, substitutions and varies in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
   a terminal group configured to receive a first signal and a second signal from a host;
   a first chip electrically connected the terminal group; and
   a second chip electrically connected to the first chip, wherein
   the first chip is configured to, in response to reception of the first signal, transmit a third signal corresponding to the first signal to the second chip, and
   is configured to, when the first chip has received the second signal before the first signal, refrain from transmitting the third signal to the second chip,
   the first chip includes a first memory and a fourth memory,
   the second chip includes a second memory and a third memory,
   the first signal includes a second command for writing first information into the first memory or the second memory,
   the first chip is configured to store the first information into the first memory, in response to reception of the second signal before the second command,
   the first information includes second information representing a set value of a size of data to be input or output to or from the third memory,
   the first signal includes a third command for causing the second chip to output data from the third memory, and
   the first chip is configured to:
      transmit a fourth command corresponding to the first signal to the second chip, in response to reception of the first signal after receiving the third command from the host;
      sequentially buffer first data in the fourth memory, the first data being data output from the second chip in accordance with the fourth command; and notify the host of third information representing that a size of the first data buffered in the fourth memory has reached a threshold, the threshold being defined based on the second information.

2. The semiconductor device according to claim 1, wherein
the terminal group includes a dedicated terminal for receiving the second signal.

3. The semiconductor device according to claim 1, wherein
the second signal includes a first command transmitted from the host via a terminal that transmits the first signal.

4. The semiconductor device according to claim 3, wherein
the second chip is configured to, in spite of reception of the first command, refrain from responding to the first command.

5. The semiconductor device according to claim 1, wherein
the first chip is configured to start supplying the first data from the fourth memory to the host after allowing notification of the third information.

6. The semiconductor device according to claim 1, wherein
when a data transfer rate between the host and the first chip is N times higher than a data transfer rate between the first chip and the second chip, where N is larger than one, the threshold is calculated by multiplying a data size indicated by the second information by (1−1/N).

7. A method of controlling a first chip electrically connected to a second chip, the method comprising:
causing, in response to reception of a first signal from a host, the first chip to transmit a second signal corresponding to the first signal to the second chip; and
causing, when a third signal is received before the first signal from the host, the first chip to refrain from transmitting the second signal to the second chip, wherein
the first chip includes a first memory and a fourth memory,
the second chip includes a second memory and a third memory,
the first signal includes a first command for writing first information into the first memory or the second memory,
the first signal includes a second command for causing the second chip to output data from the third memory, and
the first information includes second information representing a set value of a size of data to be input or output to or from the third memory,
the method further comprising:
storing first information into the first memory, in response to reception of the third signal before the first command,
transmitting a third command corresponding to the first signal to the second chip, in response to reception of the first signal after receiving the second command from the host,
sequentially buffering first data in the fourth memory, the first data being data output from the second chip in accordance with the third command; and
transferring, to the host, third information representing that a size of the first data buffered in the fourth memory has reached a threshold, the threshold being defined based on the second information.

8. The method according to claim 7, further comprising starting supplying the first data from the fourth memory to the host after the size of the first data buffered in the fourth memory has reached the threshold.

9. The method according to claim 8, further comprising when a data transfer rate between the host and the first chip is N times higher than a data transfer rate between the first chip and the second chip, where N is larger than one, calculating the threshold by multiplying a data size indicated by the second information by (1−1/N).

* * * * *